United States Patent
Takaura et al.

(10) Patent No.: US 6,812,540 B2
(45) Date of Patent: Nov. 2, 2004

(54) SEMICONDUCTOR INTEGRATED CIRCUIT DEVICE

(75) Inventors: Norikatsu Takaura, Kokubunji (JP); Riichiro Takemura, Tokyo (JP); Hideyuki Matsuoka, Nishitokyo (JP); Shinichiro Kimura, Kunitachi (JP); Hisao Asakura, Ome (JP); Ryo Nagai, Mizuho (JP); Satoru Yamada, Ome (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/298,682

(22) Filed: Nov. 19, 2002

(65) Prior Publication Data

US 2003/0111707 A1 Jun. 19, 2003

(30) Foreign Application Priority Data

Dec. 17, 2001 (JP) ........................................ 2001-382942

(51) Int. Cl.$^7$ .......................... H01L 29/00; H01L 23/58
(52) U.S. Cl. .......................... 257/510; 257/52; 257/524; 257/508; 257/506
(58) Field of Search .......................... 257/510, 512, 257/524, 508, 506, 513, 226, 444, 390, 202

(56) References Cited

U.S. PATENT DOCUMENTS 4,470,062 A * 9/1984 Muramatsu .................. 257/513
5,534,724 A 7/1996 Nagamine
6,439,514 B1 * 8/2002 Yamaguchi et al. ........ 257/500

FOREIGN PATENT DOCUMENTS

| JP | 5-3298 | 8/1991 |
| JP | 5-291521 | 4/1992 |
| JP | 7-335844 | 6/1994 |
| JP | 11-251583 | 3/1998 |
| JP | 2000-174225 | 12/1998 |
| JP | 2000-223663 | 2/1999 |

* cited by examiner

*Primary Examiner*—Jerome Jackson
*Assistant Examiner*—Joseph Nguyen
(74) *Attorney, Agent, or Firm*—Reed Smith LLP; Stanley P. Fisher, Esq.; Juan Carlos A. Marquez, Esq.

(57) ABSTRACT

A semiconductor integrated circuit device is provided, in which variation in the threshold voltage of a MISFET, for example, a MISFET pair that constitute a sense amplifier, can be reduced. In a logic circuit area over which a logic circuit such as a sense amplifier circuit required to drive a memory cell is formed, n-type active areas having no gate electrode are arranged at both edges of active areas over which a p-channel MISFET pair for constituting a sense amplifier are formed. Assuming that the width between active areas nwp1 and nw1 is L4, the width between active areas nwp2 and nw2 is L6, and the width between active areas nwp1 and nwp2 is L5, (L4−L5), (L6−L5), and (L4−L6) are set equal to almost zero or smaller than twice the minimum processing dimension, so that the variation in shape of the device isolation trenches with the widths L4, L5, and L6 can be reduced, and the threshold voltage difference in the MISFET pair can be reduced.

17 Claims, 29 Drawing Sheets

FIG. 16

SEMICONDUCTOR INTEGRATED CIRCUIT DEVICE

TECHNICAL FIELD OF THE INVENTION

The present invention relates to a semiconductor integrated circuit device. More particularly, the present invention relates to a technology effectively applied to a semiconductor integrated circuit device provided with a high-density integrated memory circuit, a logic embedded DRAM in which a memory circuit and a logic circuit are provided on the same semiconductor substrate, and an analog circuit, which use a MISFET pair formed by the use of device isolation trenches.

BACKGROUND OF THE INVENTION

For example, a device isolation trench is used for the isolation of MISFETs in a logic embedded memory in which a DRAM (Dynamic Random Access Memory) and a logic circuit composed of a MISFET (Metal Insulator Semiconductor Field Effect Transistor) and the like are provided on the same semiconductor substrate. Note that a device relative to this type of device is disclosed in the gazette of Japanese Patent Laid-Open No. 2000-174225.

SUMMARY OF THE INVENTION

In the device isolation technique using the device isolation trench for isolating the devices, the shape of a device isolation trench is changed depending on the degree of density of the device isolation trench areas and the device active areas, more specifically, depending on the width of the device isolation trench.

As a result, there arises a problem of the threshold voltage difference between the MISFET pair used in a sense amplifier circuit in which constant electric characteristics are required.

An object of the present invention is to provide a technique capable of improving the characteristics of a MISFET, in which constant electric characteristics are required, in a semiconductor integrated circuit device provided with a DRAM, a logic embedded memory, and an analog circuit, which use device isolation trenches. In particular, the object is to provide a technique capable of improving the characteristics of a MISFET pair that constitutes a sense amplifier circuit.

Another object of the present invention is to achieve a high performance of a semiconductor integrated circuit device.

Another object of the present invention is to achieve high integration of a semiconductor integrated circuit device.

The above and other objects and novel characteristics of the present invention will be apparent from the description and the accompanying drawings of this specification.

The typical ones of the inventions disclosed in this application will be briefly described as follows.

The device isolation trenches that contact to the edges of an active area on which gate electrodes of a MISFET pair are arranged are designed to have the same width. Alternatively, the width difference between the trenches is reduced to be smaller than twice the minimum processing dimension. As a result, the shapes of the device isolation trenches determined in accordance with the widths thereof are almost equal to each other, and thus, the threshold voltage difference in the MISFET pair caused from the difference in shape of the device isolation trenches is reduced. Therefore, the performance of a sense amplifier comprised of the MISFET is improved and the refresh characteristics of a DRAM memory cell can be improved.

Also, the threshold voltage difference caused from the difference in shape of the device isolation trenches is particularly large in a p-channel MISFET. Therefore, if only the width difference between the device isolation trenches that contact to the edges of the active area over which the p-channel MISFET pair is arranged is reduced to almost zero or to be smaller than twice the minimum processing dimension, the high integration in the active area of the n-channel MISFET pair can be achieved, and the threshold voltage difference between the p-channel MISFET pair caused from the difference in shape of the device isolation trenches can be reduced.

In addition, in a sense amplifier circuit in which a plurality of active areas, each having a MISFET pair arranged thereon, are successively arranged, if the width difference between the device isolation trenches that contact to the edges of the active area over which the MISFET pair is arranged is reduced to almost zero or to be smaller than twice the minimum processing dimension, the sense amplifier pitch can be expanded more than twice, and the threshold voltage difference between the n-channel MISFET pair caused from the difference in shape of the device isolation trenches can be reduced.

In addition, in the sense amplifier circuit in which a plurality of active areas, each having a p-channel MISFET pair arranged thereon, are successively arranged, if only the width difference between the device isolation trenches that contact to the edges of the active area over which the p-channel MISFET pair is arranged is reduced to almost zero or to be smaller than twice the minimum processing dimension, the sense amplifier pitch can be expanded more than twice, and the high integration in the active area of the n-channel MISFET pair can be achieved, and further, the threshold voltage difference between the p-channel MISFET pair caused from the difference in shape of the device isolation trenches can be reduced.

In addition, in a sense amplifier circuit in which a plurality of active areas, each having a MISFET pair arranged thereon, are successively arranged, for example, p-well active areas are used as active areas closest to the active area of the n-channel MISFET pair and n-well active areas (n-type active area) are used as active areas closest to the active area of the p-channel MISFET pair, whereby the difference between the length between the active areas each having a p-channel MISFET pair arranged thereon and the length between the active areas each having an n-channel MISFET pair arranged thereon can be reduced to almost zero or to be smaller than twice the minimum processing dimension. As a result, the threshold voltage difference in the MISFET pair can be reduced.

In addition, in a sense amplifier circuit in which a plurality of active areas, each having a MISFET pair arranged thereon, are successively arranged, for example, a p-well active area is used as either or both of the active areas closest to the active area of the p-channel MISFET pair, and the length between the active areas over which the p-channel MISFET pair is arranged is set larger than that between the active areas over which the n-channel MISFET pair is arranged, thereby making it possible to reduce the threshold voltage difference in the MISFET pairs.

Also, in a sense amplifier circuit in which a plurality of active areas each having a MISFET pair arranged thereon are arranged separately from each other, a p-well active area over which an n-channel MISFET pair is arranged is arranged between the n-well active areas over which a p-channel MISFET pair is arranged, thereby isolating the p-well active area of the memory cell from the p-well active area on which an n-channel MISFET pair is arranged. By doing so, it is possible to electrically isolate the p-well active area of the memory cell from the p-well active area over which an n-channel MISFET pair is arranged. As a result, it is possible to promote the high speed driving of the sense amplifier.

Also, in a sense amplifier circuit in which a plurality of active areas each having a MISFET pair arranged thereon are arranged separately from each other, a p-well active area over which an n-channel MISFET pair is arranged is arranged between the n-well active areas over which a p-channel MISFET pair is arranged, thereby isolating the p-well active area of the memory cell from the p-well active area over which an n-channel MISFET pair is arranged, and the width difference between the device isolation trenches that contact to the edges of the active area over which gate electrodes of the MISFET pair are arranged is reduced to almost zero or to be smaller than twice the minimum processing dimension. By doing so, it is possible to electrically isolate the p-well active area of the memory cell from the p-well active area over which an n-channel MISFET pair is arranged. Therefore, it is possible to promote the high speed driving of the sense amplifier, and the threshold voltage difference in the MISFET pairs can be reduced.

Also, in a sense amplifier circuit having a MISFET pair, a portion not functioning to isolate a source diffusion layer and a drain diffusion layer of the active area of the gate electrodes of a MISFET pair is provided at the edges of the active area. By doing so, the influence of the shape of the device isolation trench on the MISFET pair is reduced. Therefore, it is possible to reduce the threshold voltage difference in the MISFET pair.

BRIEF DESCRIPTIONS OF THE DRAWINGS

FIG. 16 is a sectional view showing the principal part of the substrate in the course of the manufacturing process of the semiconductor integrated circuit device shown in FIG. 2;

Figure 21:
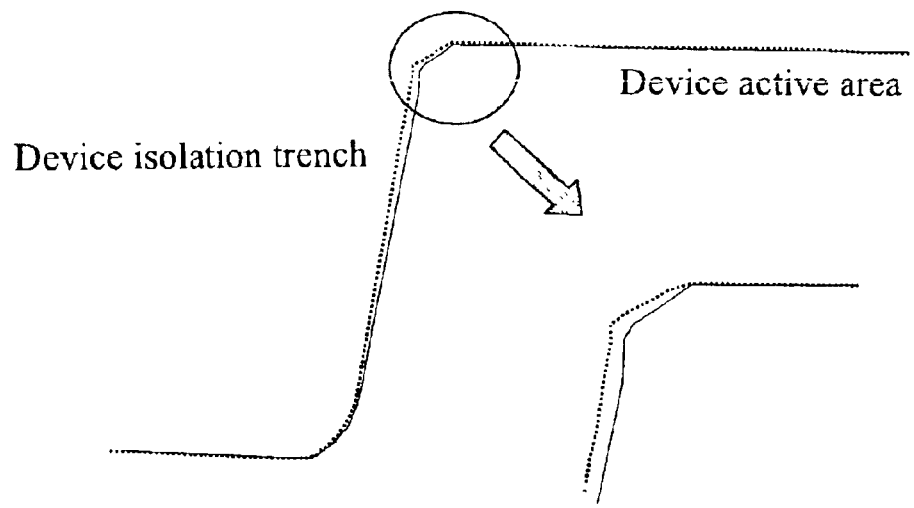
Figure 22:
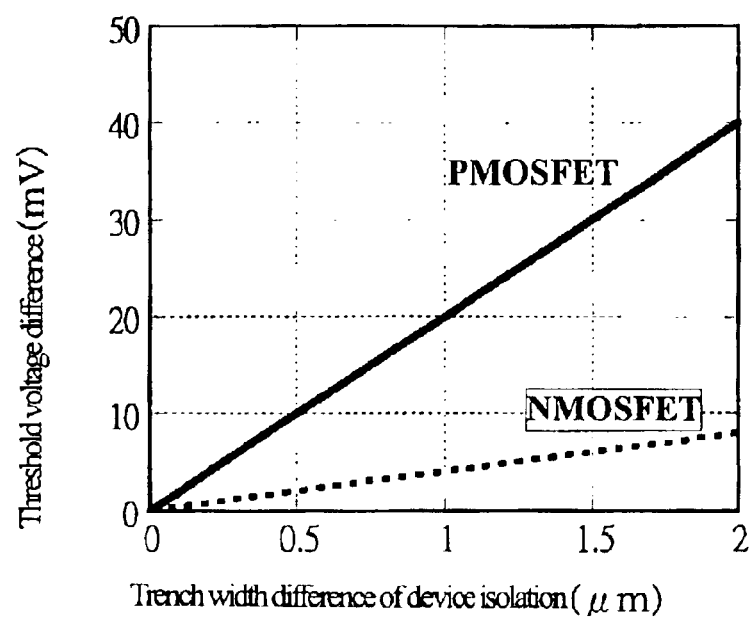
Figure 23:
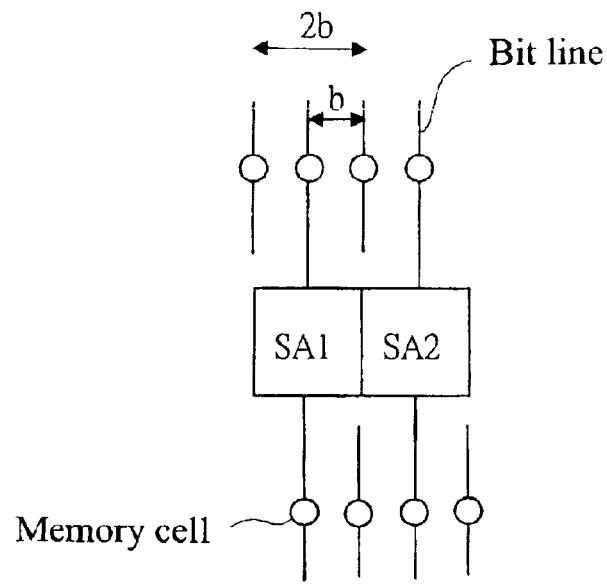
Figure 24:
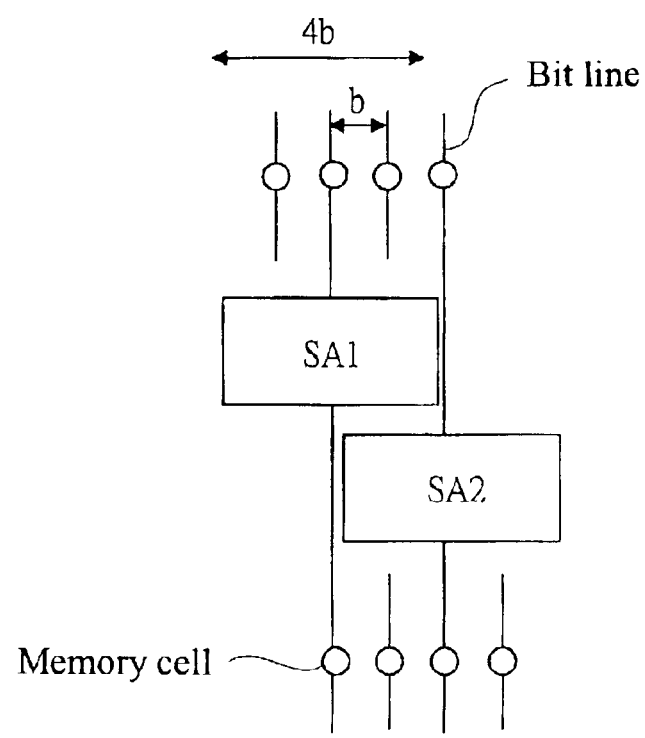
Figure 25:
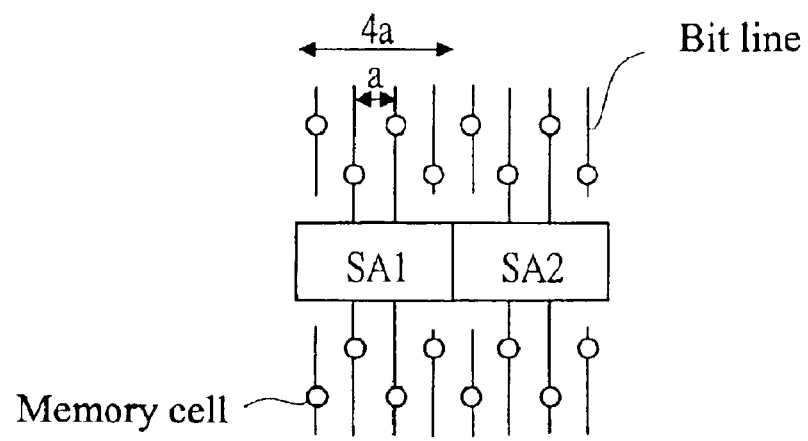
Figure 26:
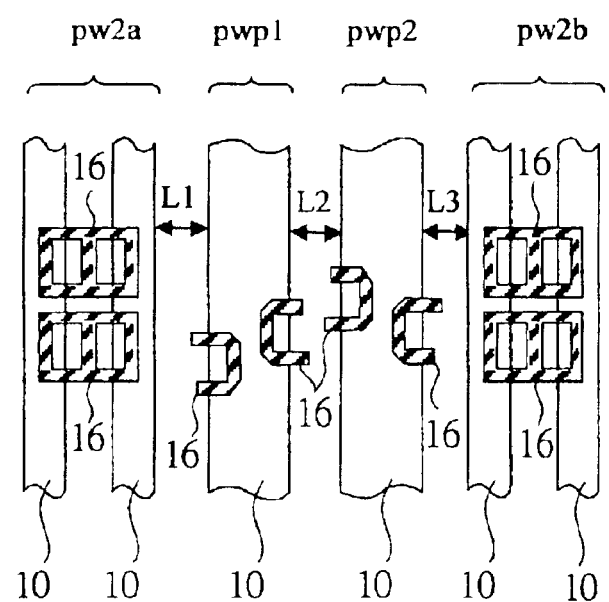
Figure 27:
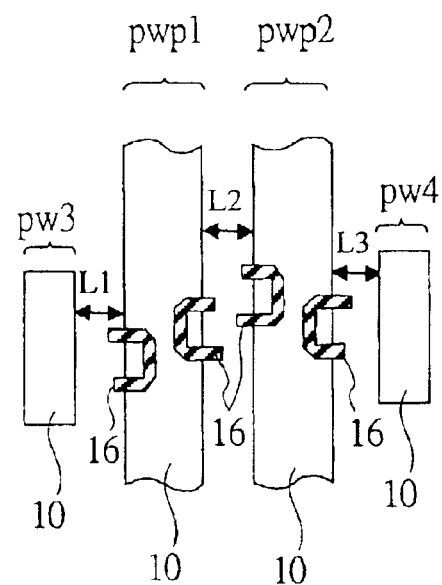
Figure 28:
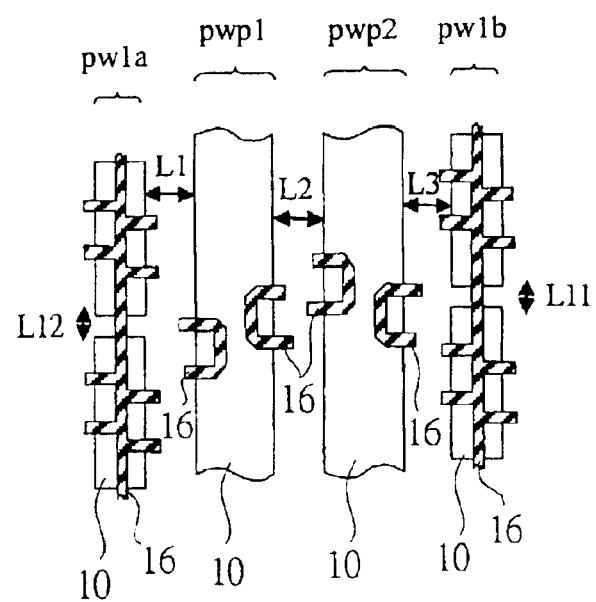
Figure 29:
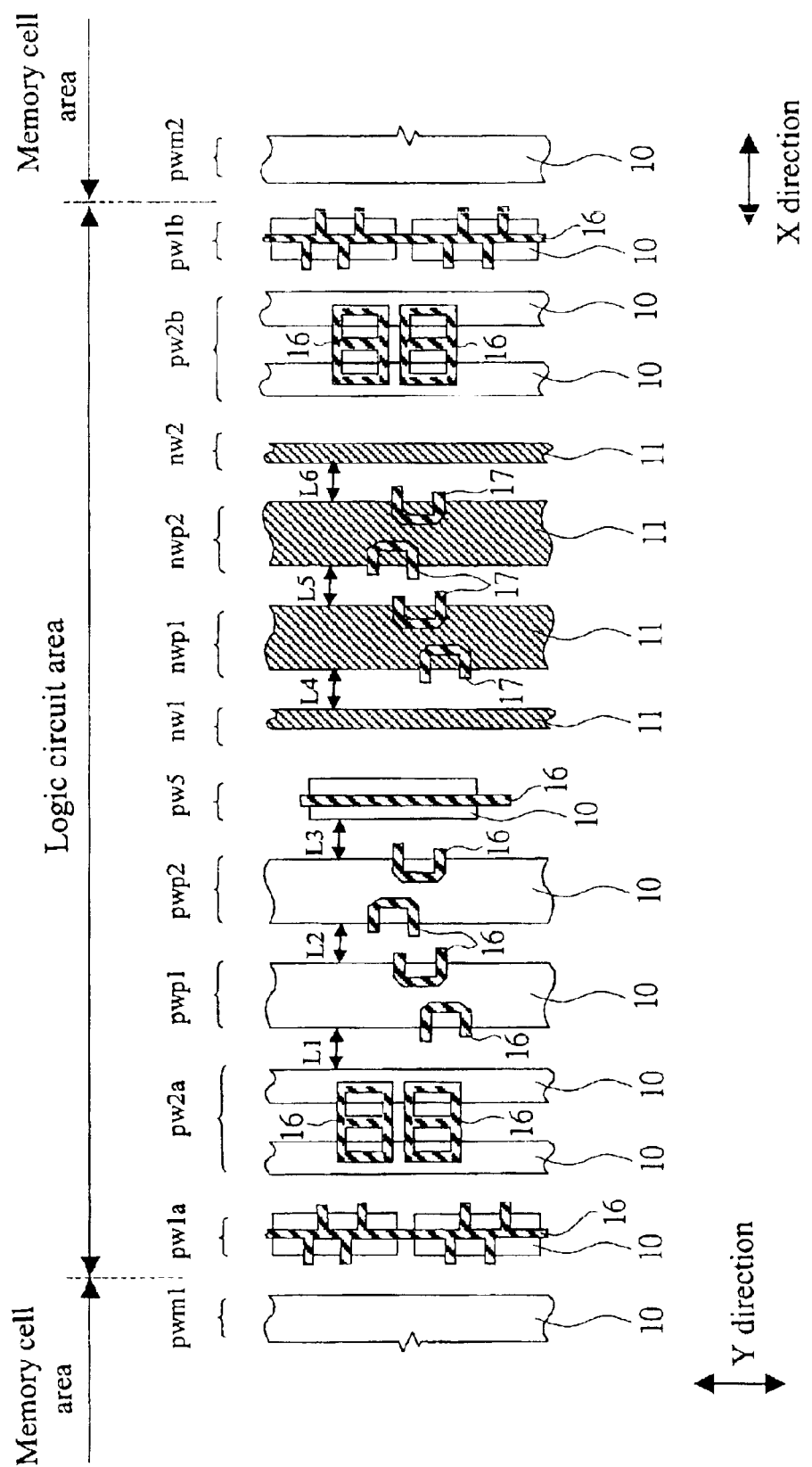
Figure 30:
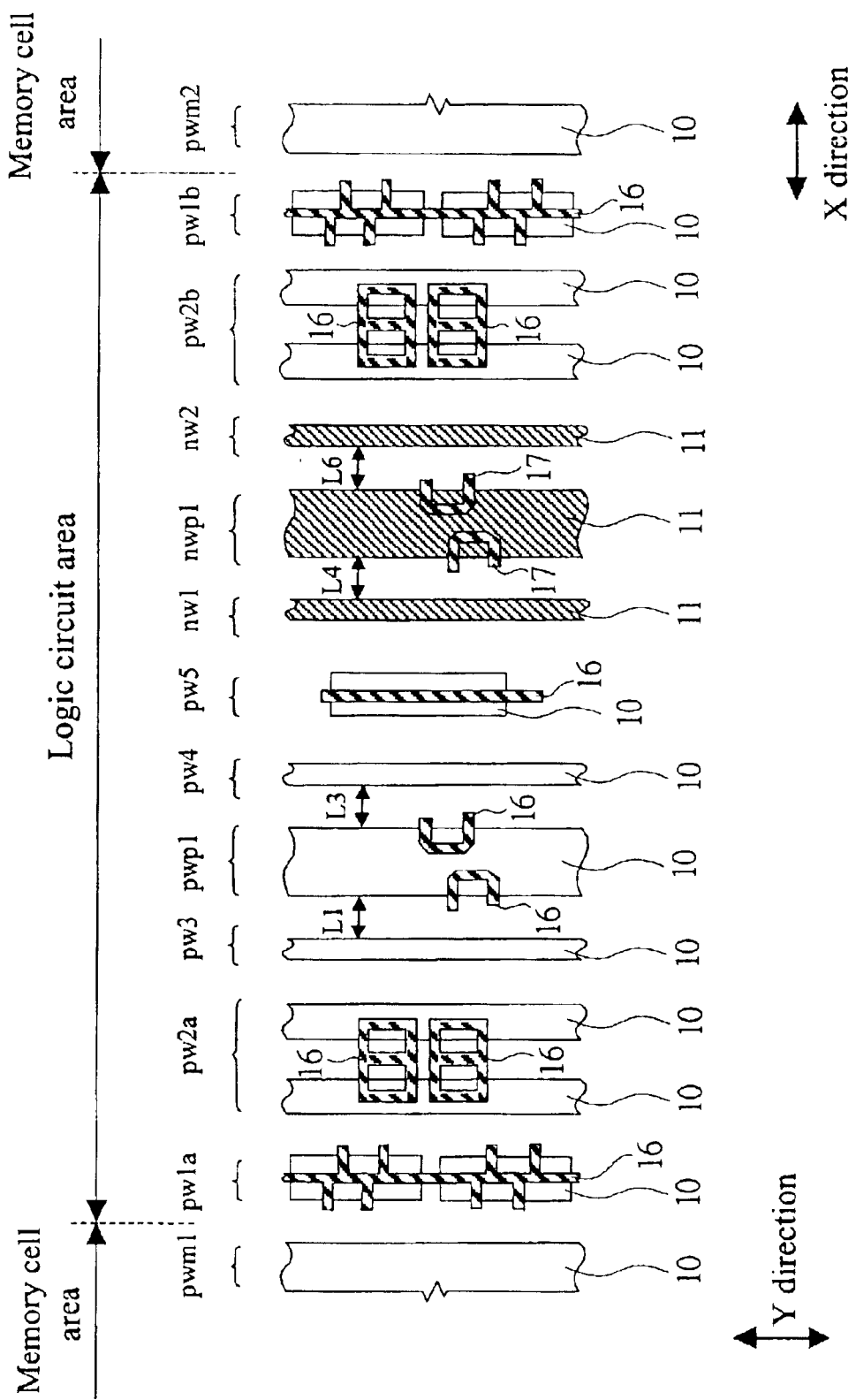
Figure 31:
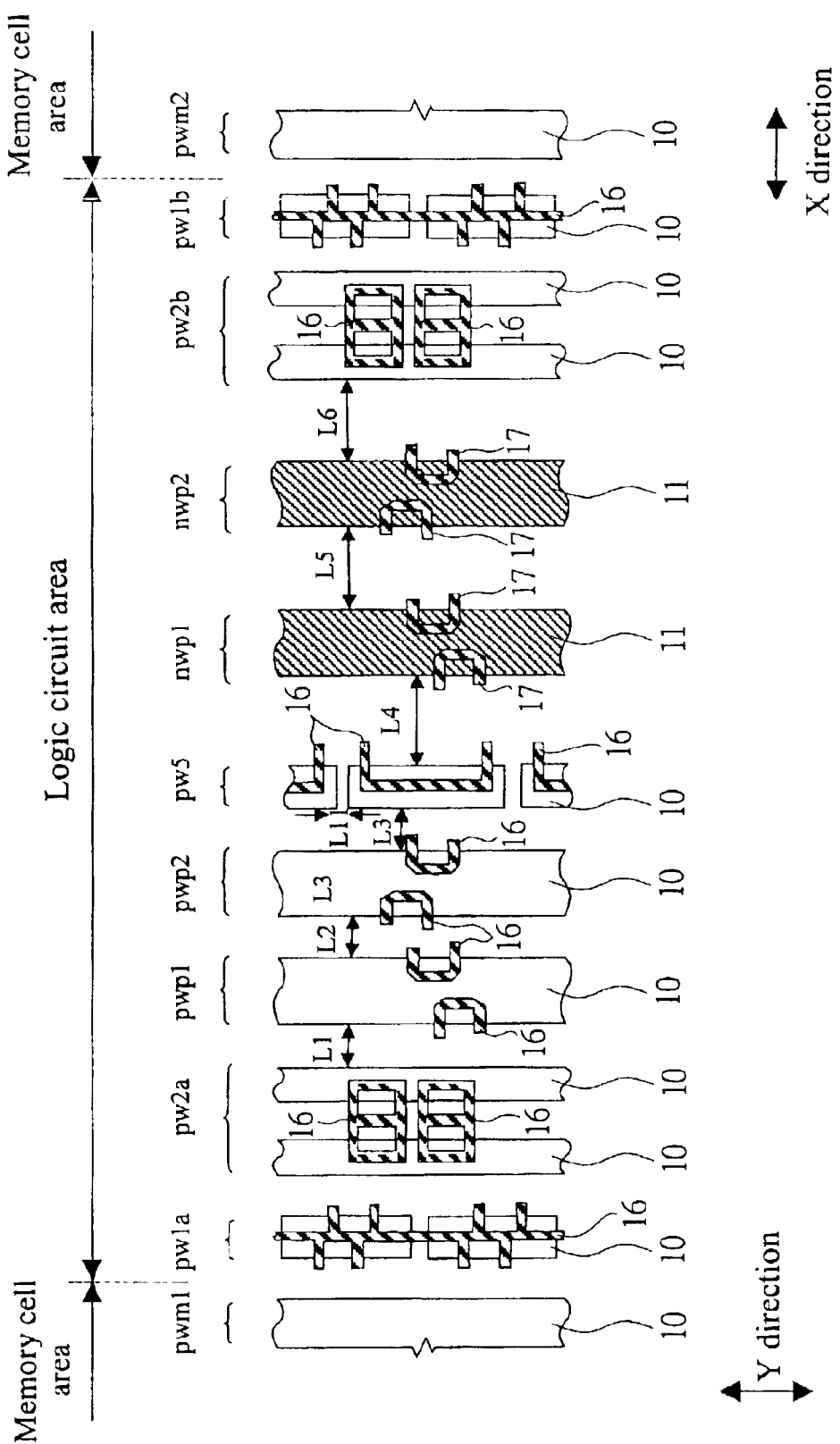
Figure 32:
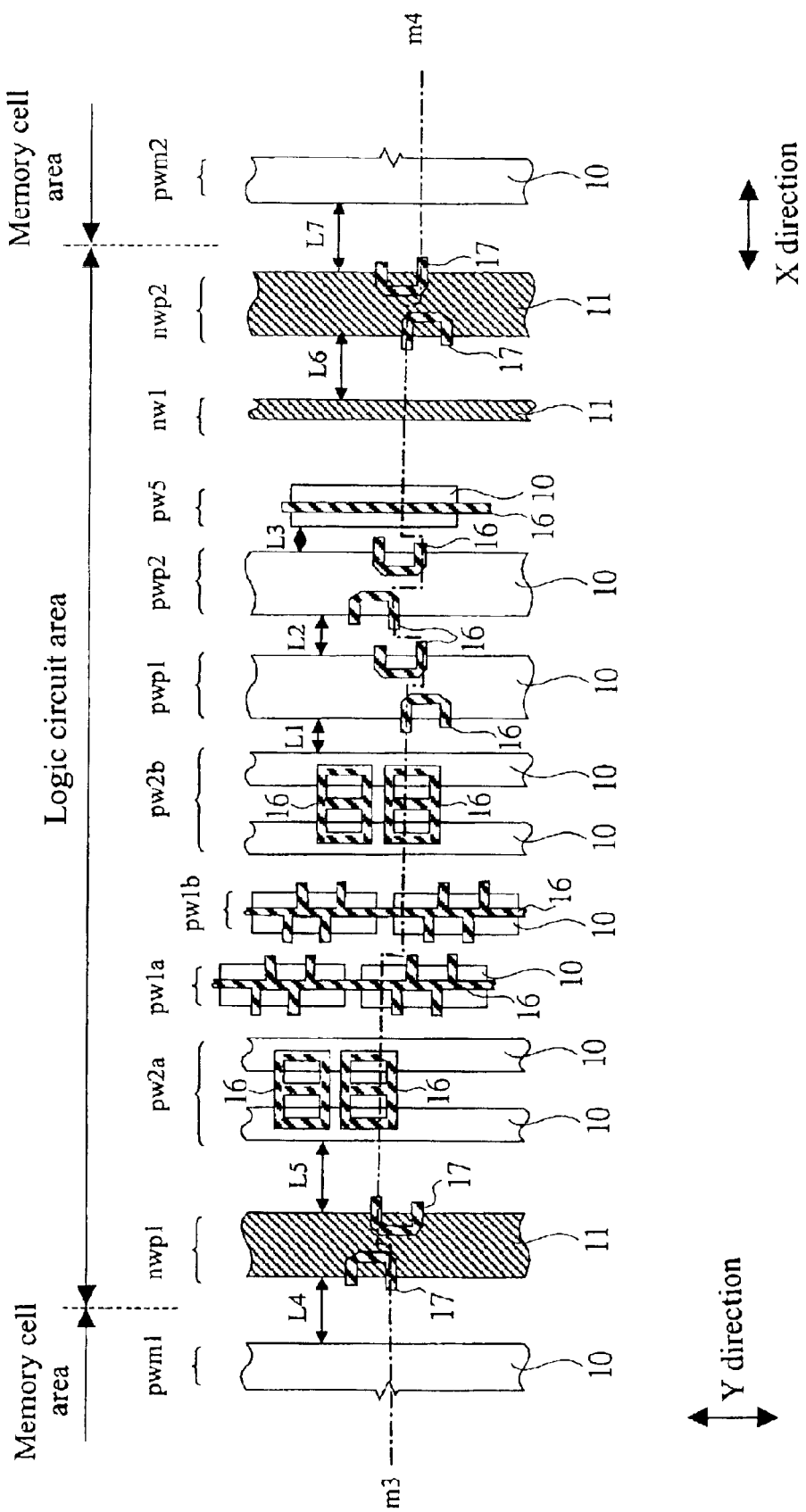
Figure 33:
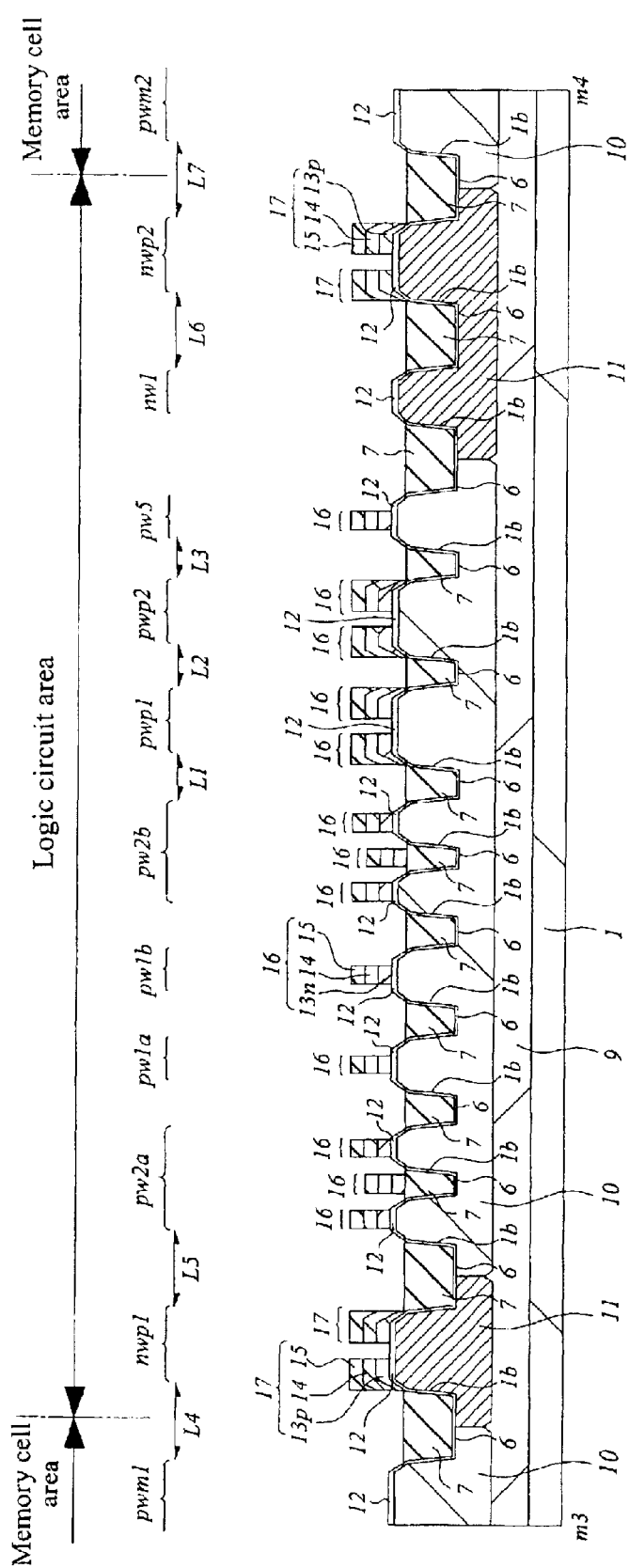
Figure 34:
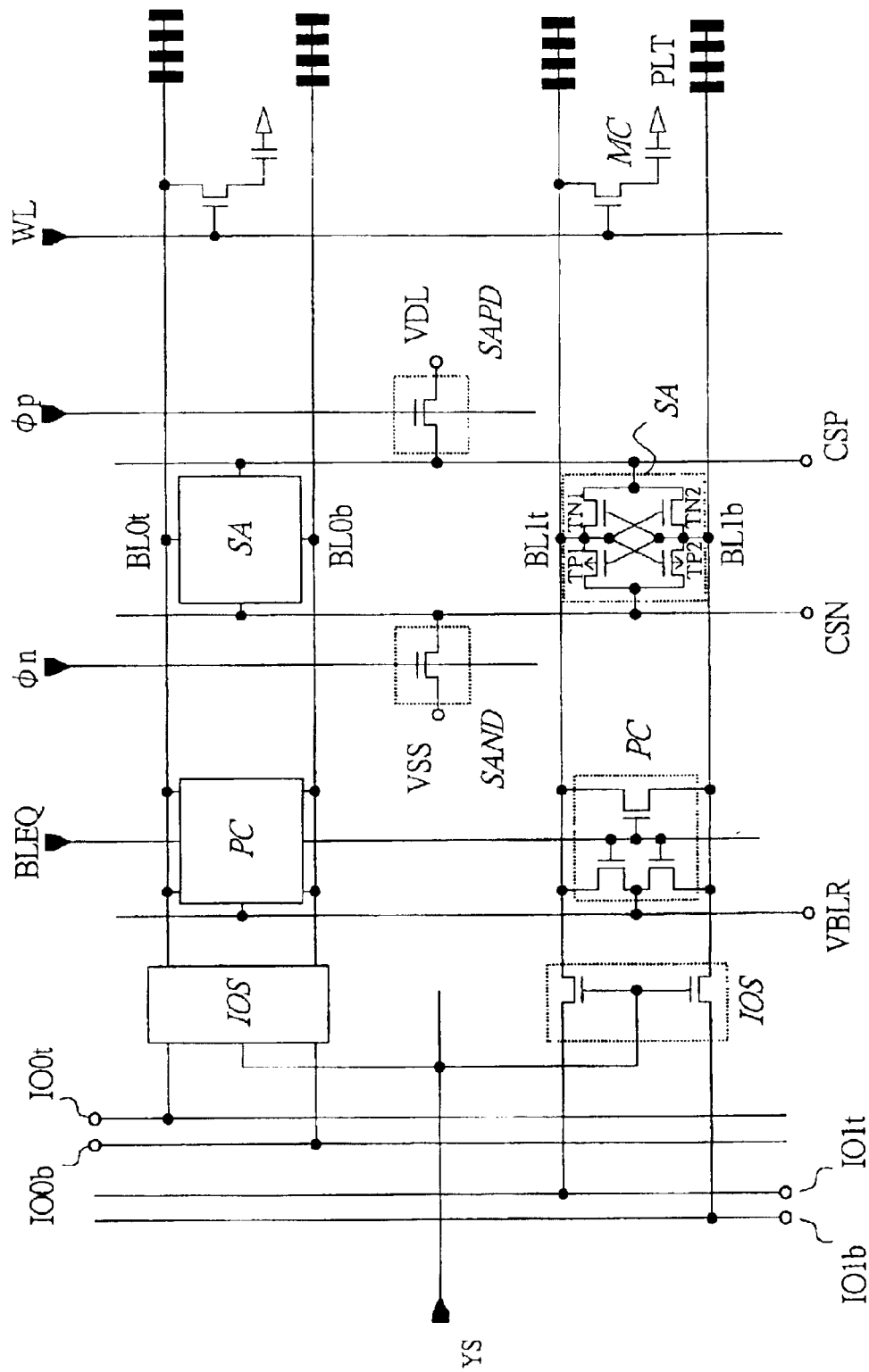

FIG. 21 a sectional view showing the principal part of the semiconductor integrated circuit device, which is used to explain the advantages of the present invention;

FIG. 22 is a correlation diagram of the width difference between the device isolation trenches and the threshold voltage difference;

FIG. 23 is a layout diagram schematically showing the arrangement of the bit lines and sense amplifiers;

FIG. 24 is a layout diagram schematically showing the arrangement of the bit lines and sense amplifiers;

FIG. 25 is a layout diagram schematically showing the arrangement of the bit lines and sense amplifiers;

FIG. 26 is another layout diagram showing the principal part of the semiconductor integrated circuit device according to the first embodiment of the present invention;

FIG. 27 is another layout diagram showing the principal part of the semiconductor integrated circuit device according to the first embodiment of the present invention;

FIG. 28 is another layout diagram showing the principal part of the semiconductor integrated circuit device according to the first embodiment of the present invention;

FIG. 29 is a layout diagram showing the principal part of the semiconductor integrated circuit device according to the second embodiment of the present invention;

FIG. 30 is a layout diagram showing the principal part of the semiconductor integrated circuit device according to the third embodiment of the present invention;

FIG. 31 is a layout diagram showing the principal part of the semiconductor integrated circuit device according to the fourth embodiment of the present invention;

FIG. 32 is a layout diagram showing the principal part of the semiconductor integrated circuit device according to the fifth embodiment of the present invention;

FIG. 33 is a sectional view showing the principal part of the substrate in the course of the manufacturing process of the semiconductor integrated circuit device according to the sixth embodiment of the present invention; and FIG. 34 is a circuit diagram showing an example of the sense amplifier circuit and the like.

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiment, and the repetitive description thereof is omitted.

(First Embodiment)

Figure 1:
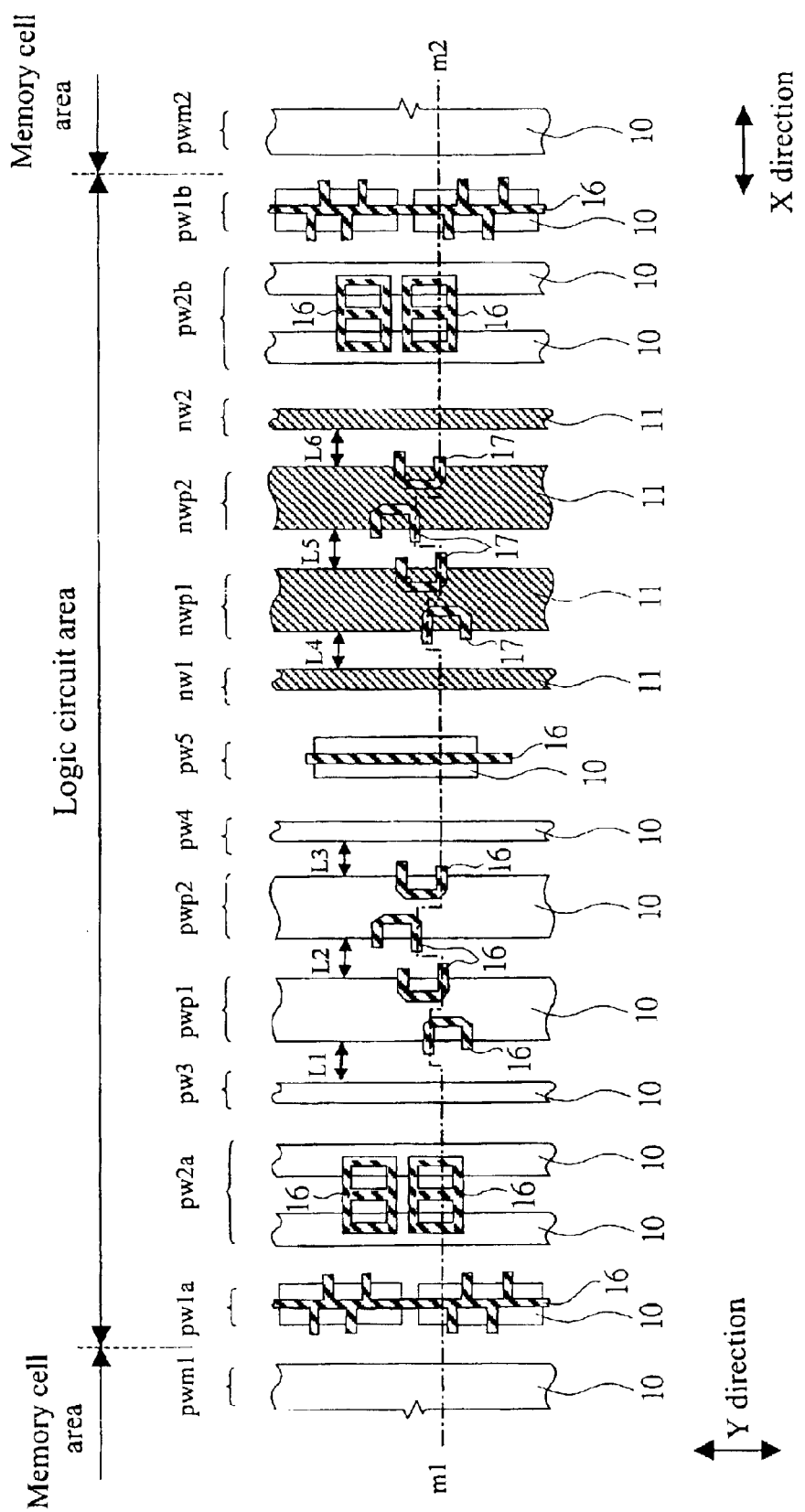
FIG. 1 is a layout diagram showing the principal part of the semiconductor integrated circuit device according to the first embodiment of the present invention.

FIG. 1 is a layout diagram showing the principal part of the semiconductor integrated circuit device according to the first embodiment of the present invention. As described later, FIG. 1 shows a layout diagram of logic circuits (for example, a sense amplifier circuit, a precharge circuit, an equalizer circuit, and an I/O selector circuit) used to drive a memory cell such as a DRAM (Dynamic Random Access Memory) memory cell, and the areas pw1a to pw1b in FIG. 1 are defined to be a logic circuit area. Memory cell areas pwm1 and pwm2 on which a DRAM memory cell is formed are located on both edges of the logic circuit area. Memory cells are arrayed in these memory cell areas. However, descriptions of the memory cell array are omitted in FIG. 2. In addition, the boundary portions between the edges of the memory cell areas, that is, memory cell array and the logic circuit area are shown in FIG. 2.

Figure 2:
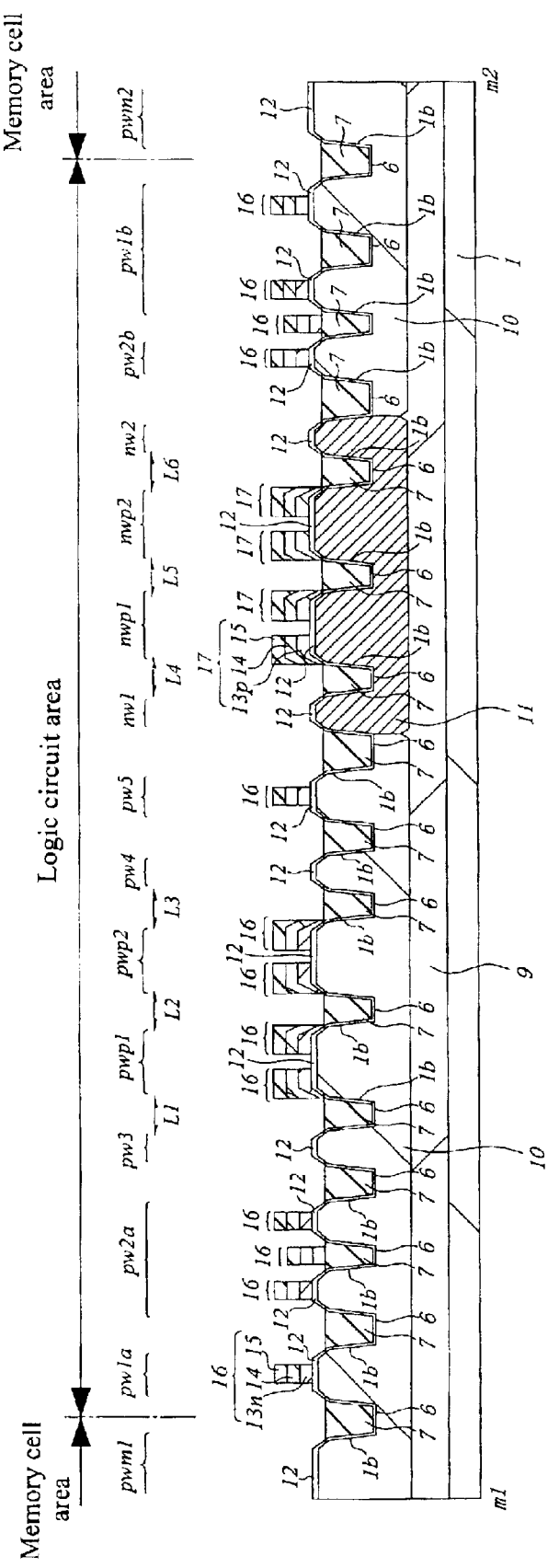
FIG. 2 is a sectional view showing the principal part of the semiconductor integrated circuit device according to the first embodiment of the present invention.

FIG. 2 is a sectional view showing the principal part of the semiconductor integrated circuit device according to the first embodiment of the present invention, which is taken along the chain line m1–m2 in the layout diagram of FIG. 1. FIGS. 3 to 17 are sectional views showing the principal part of the semiconductor integrated circuit device of FIG. 2 in the course of the manufacturing process of the same.

First, the cross-sectional structure of the logic circuit area of the DRAM according to the first embodiment will be described with reference to FIG. 2. A semiconductor substrate 1 is made of, for example, p-type single crystal silicon, and a deep n-well area 9 is formed in the semiconductor substrate 1. An n-type impurity such as phosphorus is introduced into the deep n-well area 9, which extends from the memory cell areas pwm1 and pwm2.

A p-well 10 is formed in the semiconductor substrate 1 in the logic circuit area. A p-type impurity such as boron is introduced into the p-well 10. The concentration of the p-type impurity is, for example, about $10^{17}$ (hereinafter, referred to as "10e17") to 10e18/cm$^3$.

An n-well 11 is formed in the semiconductor substrate 1 in the logic circuit area. An n-type impurity such as phosphorus or arsenic (As) is introduced into the n-well 11. The concentration of the n-type impurity is, for example, about 10e17 to 10e18/cm$^3$.

A device isolation area formed by filling a shallow trench is formed on an upper layer portion of the semiconductor substrate 1. More specifically, this device isolation area is formed in the following manner. That is, a device isolation trench 1b with a depth of about 0.3 to 0.4 µm is formed in the thickness direction of the semiconductor substrate 1, and a thin thermally-oxidized silicon (SiO$_2$) film 6 with a thickness of about 10 nm is formed on the inner wall of the trench isolation trench 1b. Thereafter, the device isolation trench 1b is filled with an insulating film 7 for isolation. The areas partitioned by the device isolation areas (insulating film 7) are so-called active areas (pwm1 to pwm2), and a device and the like are formed on the part of the active areas.

The insulating film 7 for isolation is made of, for example, silicon oxide (SiO$_2$). Note that an upper surface of the insulating film 7 for device isolation is polished by the CMP (Chemical Mechanical Polishing) method, and the height of the insulating film 7 is set a little lower than that of the main surface of the semiconductor substrate 1.

A gate insulating film 12 on the semiconductor substrate 1 is made of, for example, silicon oxide, and the thickness thereof is set to about 3.5 to 7 nm.

Also, gate electrodes 16 and 17 on the gate insulating film 12 form a polymetal structure in which a low-resistance polycrystalline silicon film 13 (13n and 13p), a tungsten nitride (WN) film (not shown), a tungsten (W) film 14, and a cap insulating film 15 are deposited in this order from below. Since the polymetal as a material of the low-resistance gate electrode has a low sheet resistance of about 2Ω/□, it is also possible to use the polymetal as the material of wiring as well as the material of the gate electrode. In this case, the low-resistance polycrystalline silicon film that constitutes the gate electrode 16 contains an n-type impurity (13n), and the low-resistance polycrystalline silicon film that constitutes the gate electrode 17 contains a p-type impurity (13p).

Subsequently, a diffusion layer area, a sidewall spacer, an interlayer insulating film, a contact electrode, a metal wiring, and a capacitor electrode of a transistor are formed. However, the descriptions thereof are omitted.

Next, the layout of the principal part in the logic circuit area of the DRAM according to the first embodiment will be described with reference to FIG. 1.

First, active areas pw1a, pw2a, pwp1, pwp2, pw5, pw2b, and pw1b (device active areas or device forming areas) of the n-channel MISFETs, each having the gate electrode 16, are formed on the p-well 10.

In addition, n-type active areas pw3 and pw4 not having the gate electrode 16 are also formed on the p-well 10. Note that the areas pwm1 and pwm2 are boundary portions between the memory cell array and the logic circuit area as mentioned above, and they are p-type active areas not having the gate electrode 16 on the p-well 10.

In addition, active areas nwp1 and nwp2 of the p-channel MISFET, each having the gate electrode 17, are formed on the n-well 11.

In addition, n-well power supply areas (active areas) nw1 and nw2 not having the gate electrode 17 are formed on the n-well 11.

Note that logic circuits such as a sense amplifier circuit of a DRAM are formed on the active area of the n-channel MISFET, the active area of the p-channel MISFET (device active area or device forming area), the p-type active area not having a gate electrode on the p-well, and the n-type active area not having a gate electrode on the n-well.

First, a precharge circuit (PC in FIG. 34) and an equalizer circuit are formed in the active areas pw1a and pw1b of the n-channel MISFET having the gate electrode 16 on the p-well 10.

Next, an I/O selector circuit (IO in FIG. 34) is formed in the active areas pw2a and pw2b of the n-channel MISFET having the gate electrode 16 on the p-well 10.

Next, a cross-coupled circuit having an n-channel MISFET pair is formed in the active areas pwp1 and pwp2 of the n-channel MISFET having the gate electrode 16 on the p-well 10 (refer to FIG. 34). The sense amplifier shown in FIG. 34 is comprised of this cross-coupled circuit and the later-described cross-coupled circuit having a p-channel MISFET pair. FIG. 34 shows an example of a circuit diagram including the sense amplifier circuit SA and the like. As shown in FIG. 34, the sense amplifier circuit SA is comprised of an n-channel MISFET pair (TN1 and TN2) and a p-channel MISFET pair (TP1 and TP2). These MISFET pairs are connected in series between the bit lines (for example, between BL1*t* and BL1*b*)(more specifically, they share a source area or a drain area), each of the gate electrodes is connected to the bit line that is not connected to the gate electrode itself (more specifically, each of the electrodes is connected to a source-drain area that is not coupled with other MISFETs.).

Although not shown in FIG. 1, the gate electrodes of the n-channel MISFET pair in the active area pwp1 or pwp2 and the source-drain areas thereof are cross-connected to each other by bit lines.

Next, a sense drive circuit (SAND and SAPD in FIG. 34) is formed in the active area pw5 of the n-channel MISFET having the gate electrode 16 on the p-well 10.

Note that, in FIG. 34, YS denotes a Y selection line, IO1*b* and the like denote IO lines, BLEQ denotes a bit line precharging signal line, and VBLR denotes a bit line precharging power line. Also, WL denotes a word line and MC denotes a memory cell. Furthermore, CSN denotes a sense amplifier NMOS common source line, CSP denotes a sense amplifier PMOS common source line, φn denotes a sense amplifier NMOS active signal, and φp denotes a sense amplifier PMOS active signal.

Also, a dummy area located between the memory cell area and the logic circuit area is formed in each of the p-type active areas pwm1 and pwm2 not having the gate electrode on the p-well 10.

Subsequently, a dummy area arranged between the cross-coupled circuit area and the other area (in this case, an area on which an I/O selector circuit or a sense driving circuit is formed) is formed in the p-type active areas pw3 and pw4 not having the gate electrode on the p-well 10.

Also, a cross-coupled circuit having a p-channel MISFET pair is formed in the active areas nwp1 and nwp2 of the p-channel MISFET having the gate electrode 17 on the n-well 11 (refer to FIG. 34). Although not shown in FIG. 1, the gate electrodes of the p-channel MISFET pair in the active area nwp1 or nwp2 and the source-drain electrodes thereof are cross-connected to each other by bit lines.

Also, a dummy area arranged between the cross-coupled circuit area and the other logic circuit area is formed in the n-type active areas nw1 and nw2 not having the gate electrode on the n-well 11. Note that it is also possible to use the dummy area as the n-well power supply area as described above.

Figure 18:
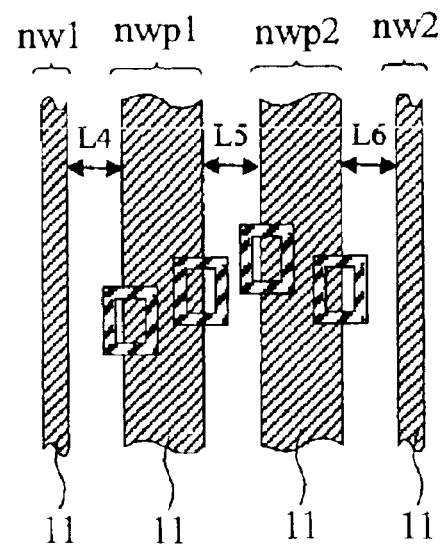
FIG. 18 is another layout diagram showing the principal part of the semiconductor integrated circuit device according to the first embodiment of the present invention.

As shown in FIG. 1, the gate electrodes (16 and 17) on a two-dimensional layout are designed to have a U-shape in this embodiment. However, it is also possible to design the gate electrode to have a shape capable of isolating the source diffusion layer and the drain diffusion layer in the active area, for example, a rectangular shape as shown in FIG. 18.

Also, it is needless to say that the active areas (pw1*a* to pw1*b*) shown in FIG. 1 are arranged in parallel to the memory cell area, more specifically, in the X direction.

Also, it is needless to say that the gate electrodes on the active areas shown in FIG. 1 are arranged on the active areas at regular intervals.

As shown in FIG. 1, this embodiment is characterized in that widths L4 and L6 of the device isolation trenches closest to the successively-arranged two active areas each having a p-channel MISFET pair are equal to width L5 between the successively-arranged two active areas each having a p-channel MISFET pair, and that widths L1 and L3 of the device isolation trenches closest to the successively-arranged two active areas each having an n-channel MISFET pair are equal to width L2 between the successively-arranged two active areas each having a pair of n-channel MISFET.

Hereinafter, the semiconductor integrated circuit device according to the embodiment will be described in detail along the manufacturing process with reference to FIGS. 3 to 17. Note that components having the same function are denoted by the same reference symbols throughout the drawings for describing the embodiment, and the repetitive description thereof is omitted.

Figure 3:
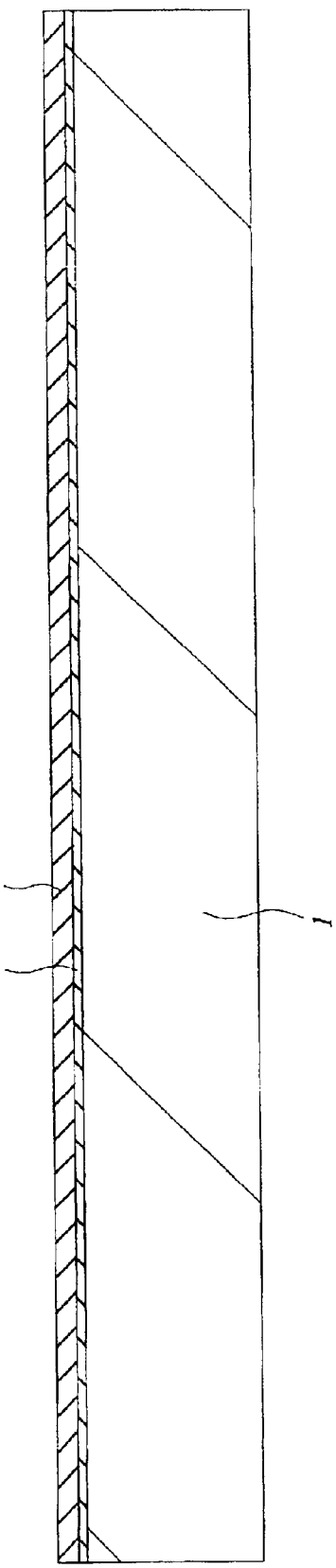
FIG. 3 is a sectional view showing the principal part of the substrate in the course of the manufacturing process of the semiconductor integrated circuit device shown in FIG. 2.

First, as shown in FIG. 3, a semiconductor substrate 1 made of p-type single crystal silicon with specific resistance of about 1 to 10 Ωcm is subjected to a thermal oxidation at about 800° C. to form a thin silicon oxide film 2 with a thickness of about 10 nm on the surface of the semiconductor substrate 1. Thereafter, a silicon nitride film 3 with a thickness of about 140 nm is deposited on the silicon oxide film 2 by the CVD method.

Figure 4:
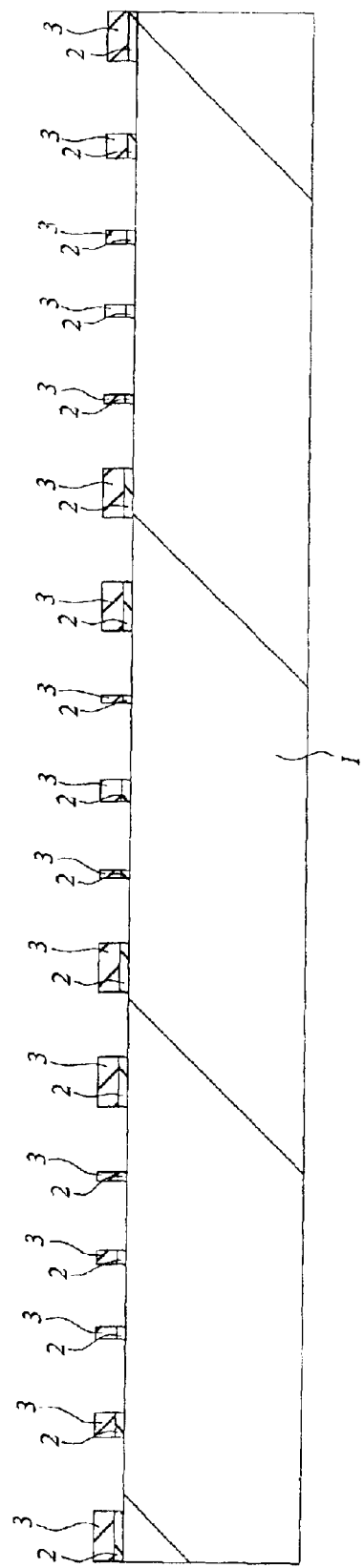
FIG. 4 is a sectional view showing the principal part of the substrate in the course of the manufacturing process of the semiconductor integrated circuit device shown in FIG. 2.

Next, the silicon nitride film 3 and the silicon oxide film 2 in the device isolation area are selectively removed by the dry etching with using a photoresist film as a mask, and the photoresist film is removed by applying an ashing treatment. The semiconductor substrate 1 in this step is shown in FIG. 4.

Figure 5:
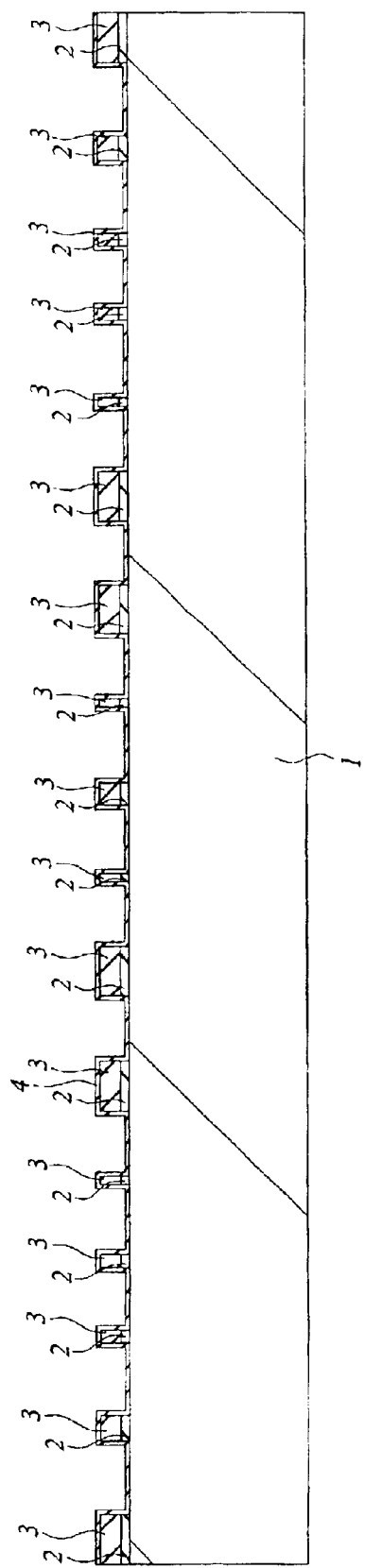
FIG. 5 is a sectional view showing the principal part of the substrate in the course of the manufacturing process of the semiconductor integrated circuit device shown in FIG. 2.

Subsequently, as shown in FIG. 5, a silicon oxide film 4 is deposited on the silicon semiconductor substrate 1 by the CVD (Chemical Vapor Deposition) method. This silicon oxide film 4 has a thickness of about 40 to 50 nm and is preferably formed by a deposition method with good step coverage like a silicon oxide film formed by the HLD (High-pressure Low-temperature Deposition) method.

Figure 6:
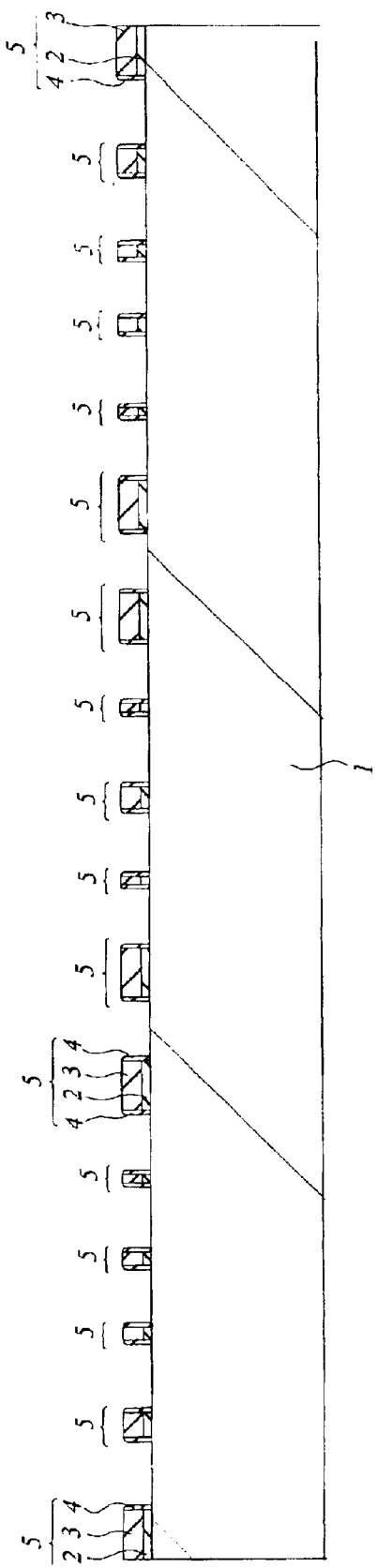
FIG. 6 is a sectional view showing the principal part of the substrate in the course of the manufacturing process of the semiconductor integrated circuit device shown in FIG. 2.

Subsequently, as shown in FIG. 6, the silicon oxide film 4 is etched back, thereby forming sidewall spacers made of the silicon oxide film 4 on the sidewalls of the layered films comprised of the silicon nitride film 3 and the silicon oxide film 2.

The layered films 5 comprised of the silicon nitride film 3 and the silicon oxide film 2 having sidewall spacers are used as a mask when forming trenches by etching the semiconductor substrate 1 in the device isolation area.

In addition, since the silicon nitride film 3 has good oxidation resistance, the silicon nitride film 3 is also used as a mask for preventing the oxidation of the surface of the semiconductor substrate 1 positioned below the silicon nitride film 3. The silicon oxide film 2 below the silicon nitride film 3 is formed in order to reduce the stress generated in the interface between the semiconductor substrate 1 and the silicon nitride film 3 and to prevent a defect on the surface of the semiconductor substrate 1 such as dislocation due to the stress. Also, the sidewall spacer made of the silicon oxide film 4 is formed in order to reduce the stress generated in the edge portions (shoulder portion) of the active area and to round the shoulder portion of the active area.

Figure 7:
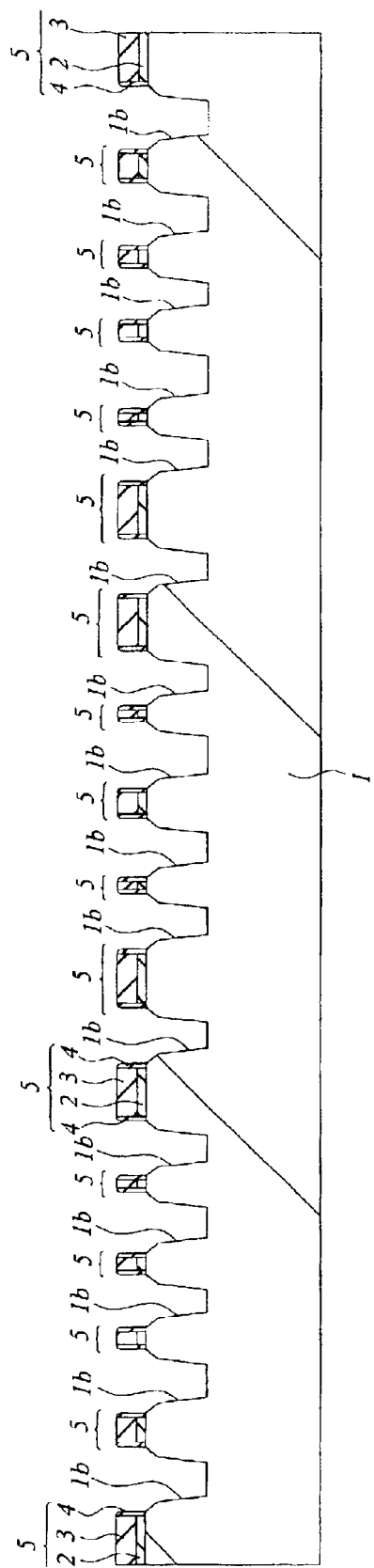
FIG. 7 is a sectional view showing the principal part of the substrate in the course of the manufacturing process of the semiconductor integrated circuit device shown in FIG. 2.

Subsequently, as shown in FIG. 7, the dry etching is performed using the layered films 5 as a mask which films are comprised of the silicon nitride film 3 and the silicon oxide film 2 having sidewall spacers made of the silicon oxide film 4, so that trenches (device isolation trench) 1*b* with a depth of about 0.3 to 0.4 micron are formed in the semiconductor substrate 1 in the device isolation area.

Figure 8:
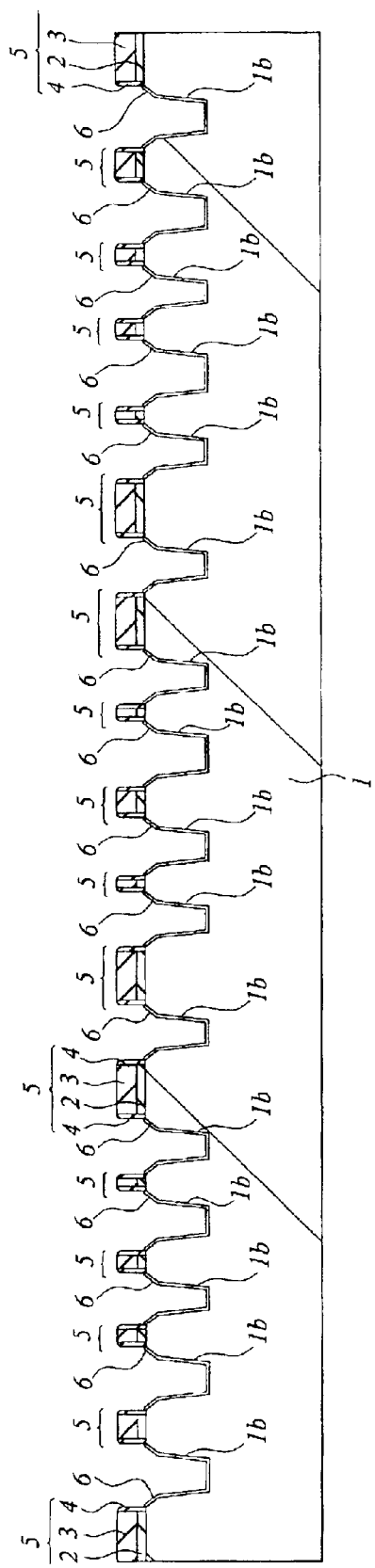
FIG. 8 is a sectional view showing the principal part of the substrate in the course of the manufacturing process of the semiconductor integrated circuit device shown in FIG. 2.

Subsequently, as shown in FIG. 8, the semiconductor substrate 1 is subjected to the thermal oxidation at 800 to 1000° C. to form a thin silicon oxide film 6 with a thickness of about 10 nm on the inner wall of the trench 1b. This oxide silicon film 6 is formed in order to repair the damages of the inner wall of the trench 1b caused from the dry etching and to reduce the stress generated in the interface between a silicon oxide film 7 buried in the trench 1b in the following step and the semiconductor substrate 1. Also, due to the thermal oxidation process, the shoulder portions of the active areas over the surface of the semiconductor substrate 1 are rounded.

Figure 9:
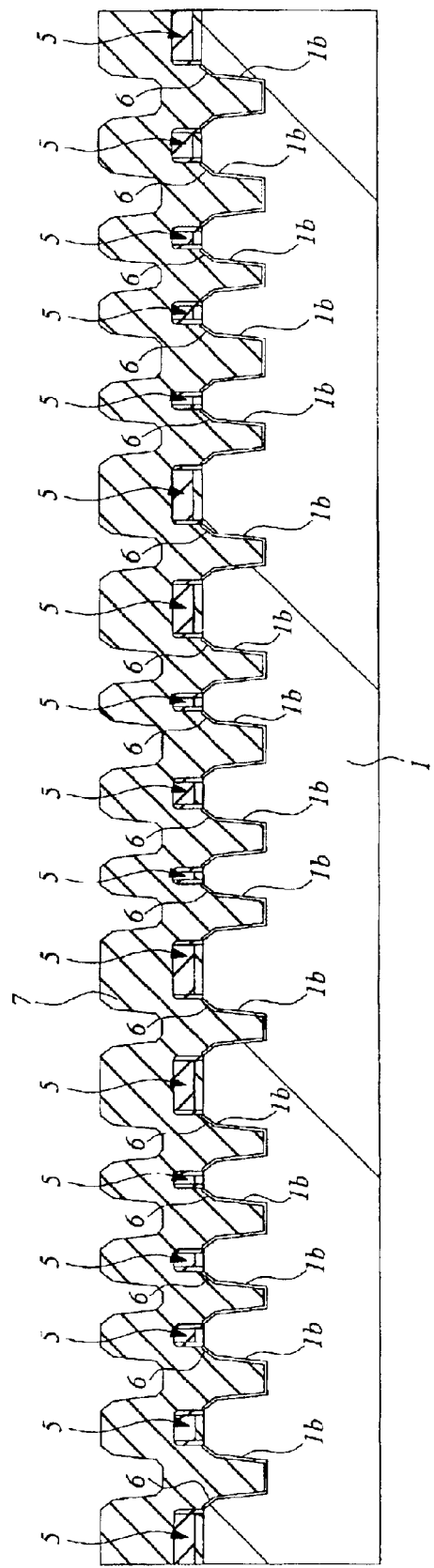
FIG. 9 is a sectional view showing the principal part of the substrate in the course of the manufacturing process of the semiconductor integrated circuit device shown in FIG. 2.

Subsequently, as shown in FIG. 9, the silicon oxide film 7 is deposited over the semiconductor substrate 1 and in the trenches 1b by the CVD method. This silicon oxide film 7 is deposited to a thickness larger than the depth of the trench 1b (for example, about 600 nm), and the silicon oxide film 7 is deposited until the trench 1b is completely filled with the silicon oxide film 7. In addition, the silicon oxide film 7 is preferably formed by a deposition method with good step coverage like a silicon oxide film deposited with using oxygen and tetraethoxysilane $((C_2H_5)_4 Si)$ as materials.

Subsequently, the semiconductor substrate 1 is subjected to the thermal oxidation at about 1000 to 1200° C. to perform the densifying (annealing) process for the improvement of the film quality of the silicon oxide film 7 buried in the trench 1b.

Figure 10:
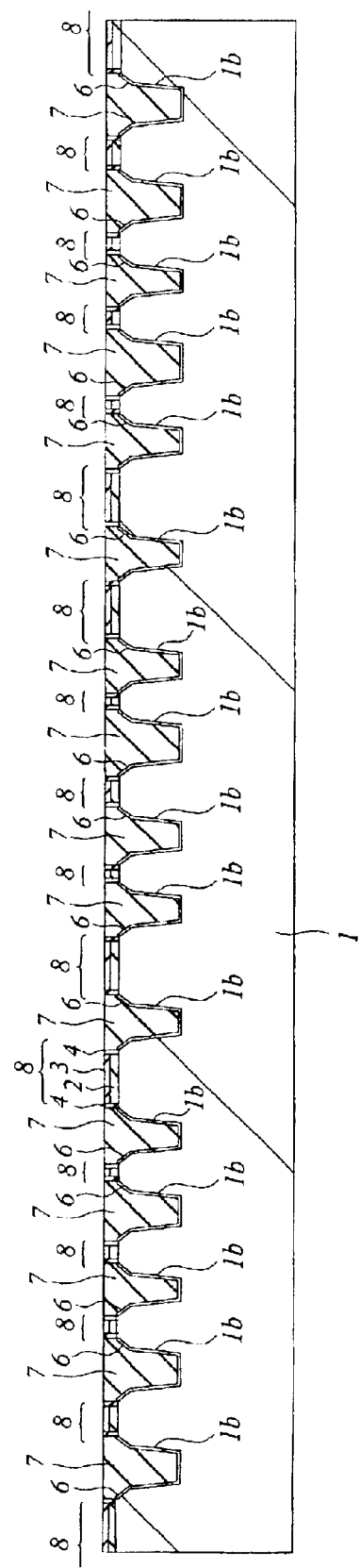
FIG. 10 is a sectional view showing the principal part of the substrate in the course of the manufacturing process of the semiconductor integrated circuit device shown in FIG. 2.

Subsequently, as shown in FIG. 10, the silicon oxide film 7 outside the trenches 1b is removed by the CMP (Chemical Mechanical Polishing) method, and the surface of the silicon oxide film 7 on the trench 1b is planarized. In this polishing process, the layered films 5 comprised of the silicon nitride film 3 and the silicon oxide film 2 having sidewall spacers made of the silicon oxide film 4 and covering the surface of the semiconductor substrate 1 in the active area are used as polishing stoppers. After the completion of the polishing, the layered films 5 become layered films 8.

Figure 11:
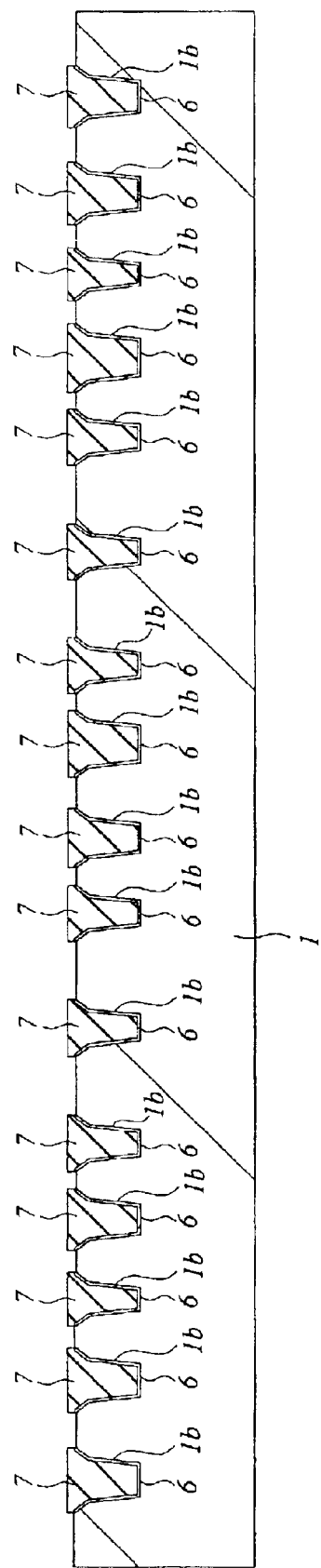
FIG. 11 is a sectional view showing the principal part of the substrate in the course of the manufacturing process of the semiconductor integrated circuit device shown in FIG. 2.

Subsequently, the layered films 8 covering the active areas of the semiconductor substrate 1 are processed with using an etching solution such as thermal phosphoric acid, and then removing the layered films 8 by the dry or wet etching. In this manner, the device isolation trenches filled with the silicon oxide film 7 are completed as shown in FIG. 11. And then, the layered films 8 are removed as shown in FIG. 11.

Figure 12:
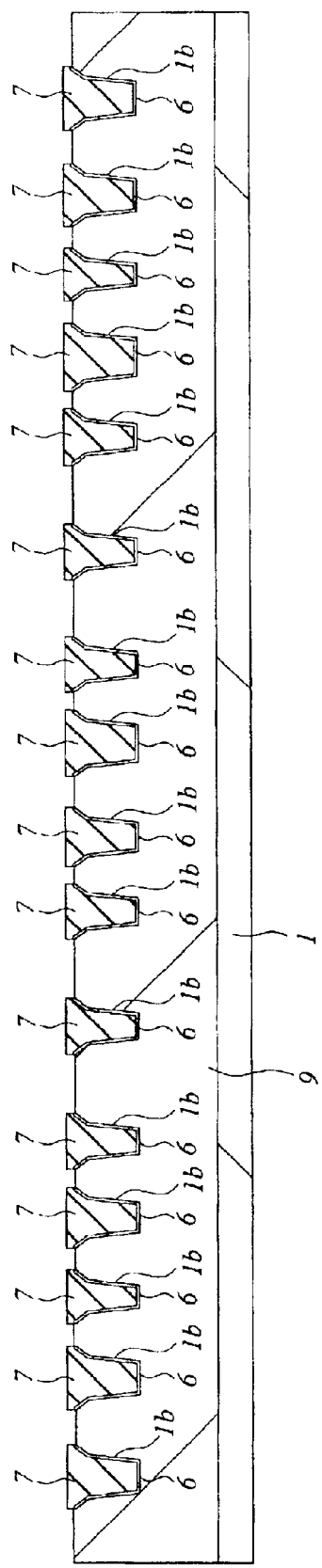
FIG. 12 is a sectional view showing the principal part of the substrate in the course of the manufacturing process of the semiconductor integrated circuit device shown in FIG. 2.

Subsequently, the semiconductor substrate 1 is subjected to pre-oxidation process to form a photoresist pattern (not shown) for forming a deep n-well. The photoresist pattern is formed so as to expose the memory cell areas on the semiconductor substrate 1. Thereafter, ions of n-type impurity such as phosphorus are implanted into the memory cell areas of the semiconductor substrate 1 by using the photoresist pattern as a mask, thereby forming a deep n-well area 9 in the memory cell area of the semiconductor substrate 1. At this time, the deep n-well area 9 is formed also in the logic circuit area of the semiconductor substrate 1 as shown in FIG. 12.

Figure 13:
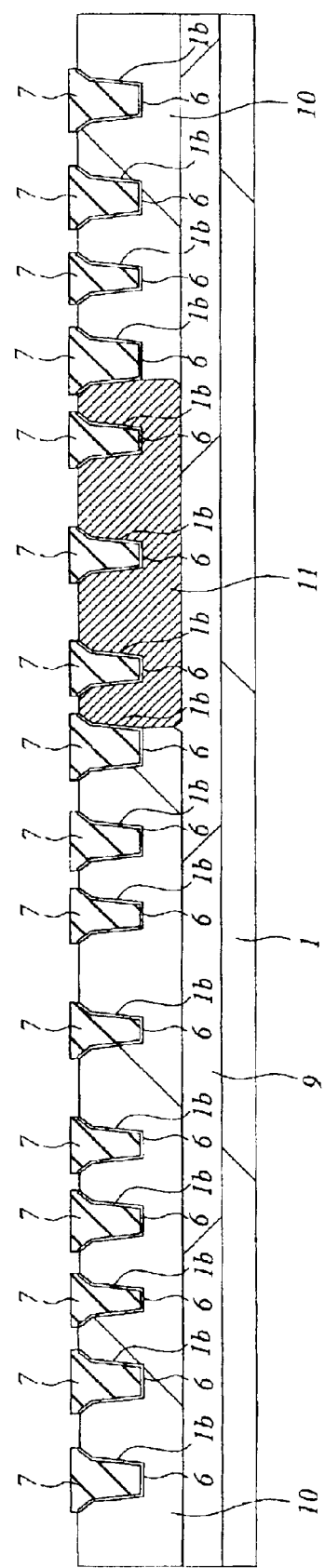
FIG. 13 is a sectional view showing the principal part of the substrate in the course of the manufacturing process of the semiconductor integrated circuit device shown in FIG. 2.

Subsequently, after the removal of the photoresist pattern for forming the deep n-well, a photoresist pattern (not shown) exposing the p-well area is formed on the semiconductor substrate 1. Then, ions of p-type impurity such as boron are implanted into the p-well forming area of the semiconductor substrate 1 by using the photoresist pattern as a mask. Thereafter, the photoresist pattern (not shown) for forming the p-well is removed and then a photoresist pattern exposing the n-well area is formed on the semiconductor substrate 1. Then, ions of n-type impurity such as phosphorus are implanted into the n-well forming area of the semiconductor substrate 1 by using the photoresist pattern as a mask. Thereafter, the photoresist pattern for forming the n-well is removed and then the semiconductor substrate 1 is subjected to the thermal treatment, thereby forming the p-well 10 and n-well 11 on the semiconductor substrate 1 as shown in FIG. 13.

Subsequently, though not shown in the drawings, after the removal of the photoresist pattern for forming an n-channel MISFET in the logic circuit area, ions of p-type impurity such as boron fluoride ($BF_2$) are implanted for the control of the threshold voltage.

Subsequently, though not shown in the drawings, after the removal of the photoresist pattern for forming the p-channel MISFET in the logic circuit area, ions of n-type impurity such as phosphorus are implanted for the control of the threshold voltage.

Subsequently, though not shown in the drawings, after the removal of the photoresist pattern for forming a memory cell selecting MISFET in the memory cell area, ions of p-type impurity such as boron are implanted for the prevention of the punch through.

Subsequently, though not shown in the drawings, the preoxide film on the semiconductor substrate 1 is removed.

Figure 14:
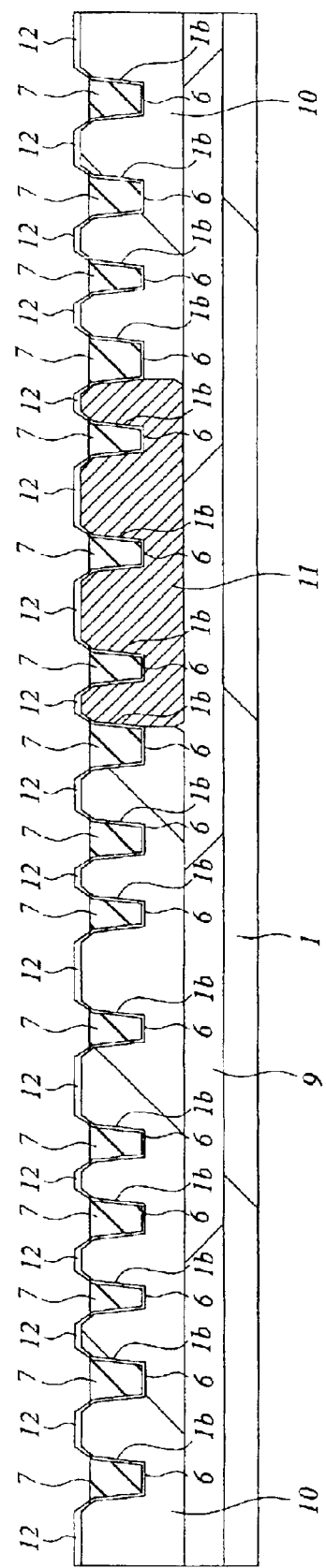
FIG. 14 is a sectional view showing the principal part of the substrate in the course of the manufacturing process of the semiconductor integrated circuit device shown in FIG. 2.

Subsequently, as shown in FIG. 14, gate insulating films 12 are formed on the resultant structure on the semiconductor substrate 1 by the method well known in the art. In this case, the gate insulating film 12 is formed by the wet oxidation process at about 750° C.

Alternatively, it is also preferable to a form gate insulating film with an appropriate thickness in accordance with the applied voltage by the method well known in the art. A relatively thick insulating film has a thickness of about 6 nm, and a relatively thin insulating film has a thickness of about 3.5 nm. It is also possible to perform the oxynitride process to the semiconductor substrate by the method well known in the art.

Due to the etching for removing the pre-oxide film and the gate insulating film on the semiconductor substrate 1, the surface of the semiconductor substrate 1 in the active area and the surface of the silicon oxide film 7 buried in the trench 1b do not form a flat surface.

Figure 15:
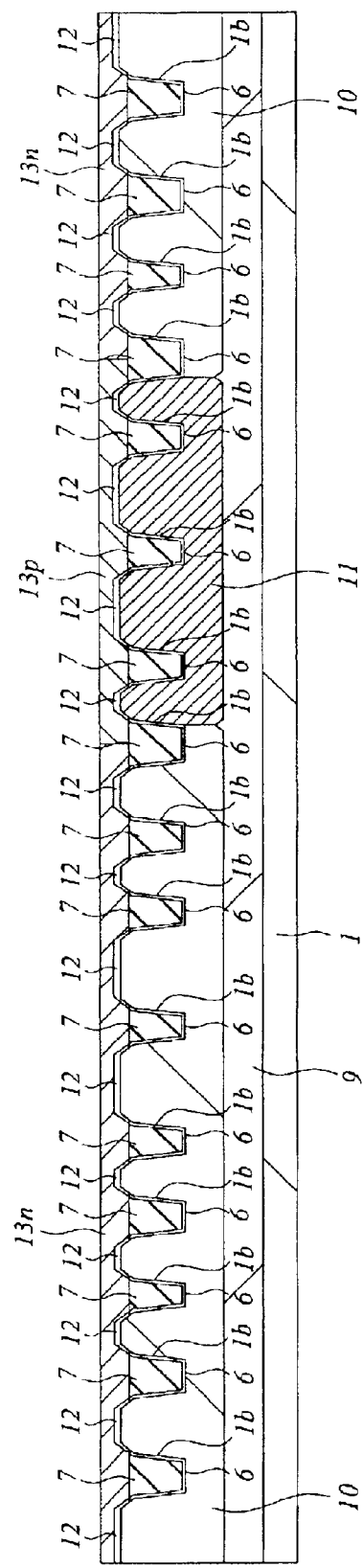
FIG. 15 is a sectional view showing the principal part of the substrate in the course of the manufacturing process of the semiconductor integrated circuit device shown in FIG. 2.

Subsequently, as shown in FIG. 15, a polycrystalline silicon film is deposited over the resultant structure on the semiconductor substrate 1 by the CVD method. Then, impurity is introduced to set the conductivity type in the gate electrode of the MISFET formed over the semiconductor substrate 1 by the method well known in the art. More specifically, a polycrystalline silicon film (n-type polycrystalline silicon film) 13n doped with n-type impurity such as phosphorus is formed in the area where the n-channel MISFET is to be formed, and a polycrystalline silicon film (p-type polycrystalline silicon film) 13p doped with p-type impurity such as boron is formed in the area where the p-channel MISFET is to be formed.

It is also possible to deposit the polycrystalline silicon film doped with n-type impurity such as phosphorus by the CVD method so as to set the conductivity type of all gate electrodes of the MISFETs formed on the semiconductor substrate 1 to be n-type.

Figure 16:
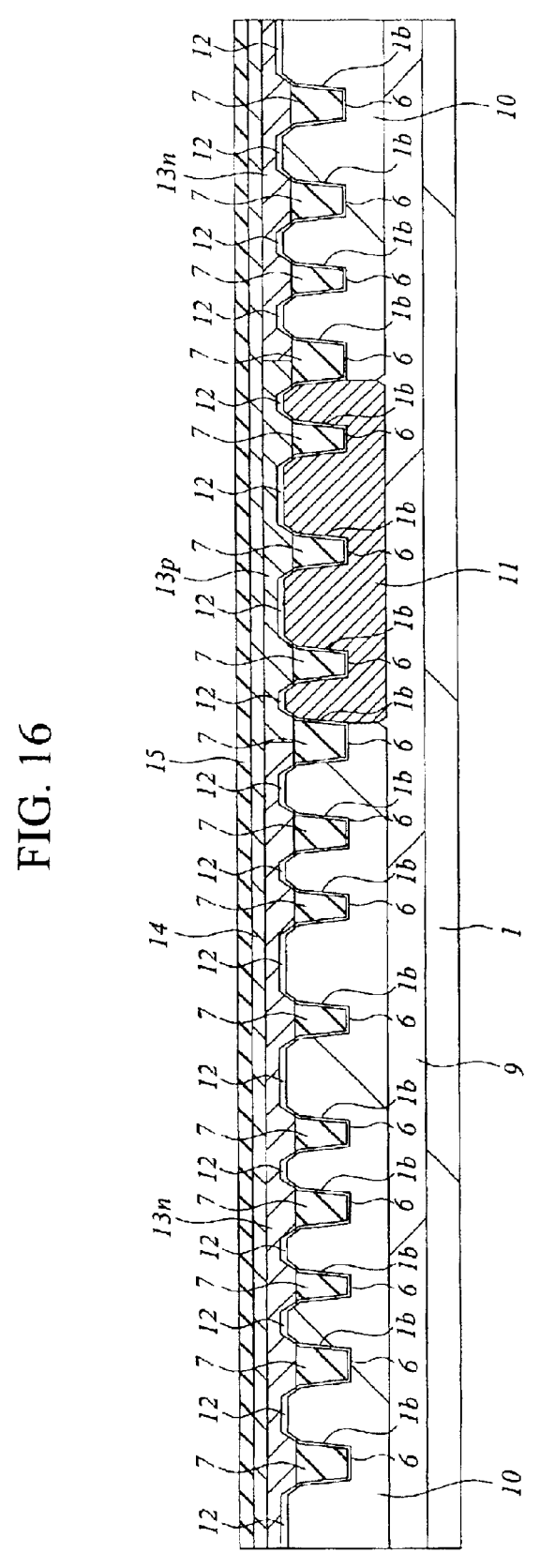

Subsequently, as shown in FIG. 16, a barrier metal film made of, for example, tungsten nitride (WN) is deposited on the polycrystalline silicon films 13n and 13p, and then, a metal film 14 made of, for example, tungsten is deposited thereon. Thereafter, a cap insulating film 15 made of, for example, silicon nitride film is deposited further thereon. Note that the illustrations of the barrier metal film are omitted.

Subsequently, the cap insulating film 15 is etched to form a hard mask. In this etching process, a photoresist (not shown) for forming a gate electrode that is formed on the cap insulating film 15 is used as an etching mask.

Figure 17:
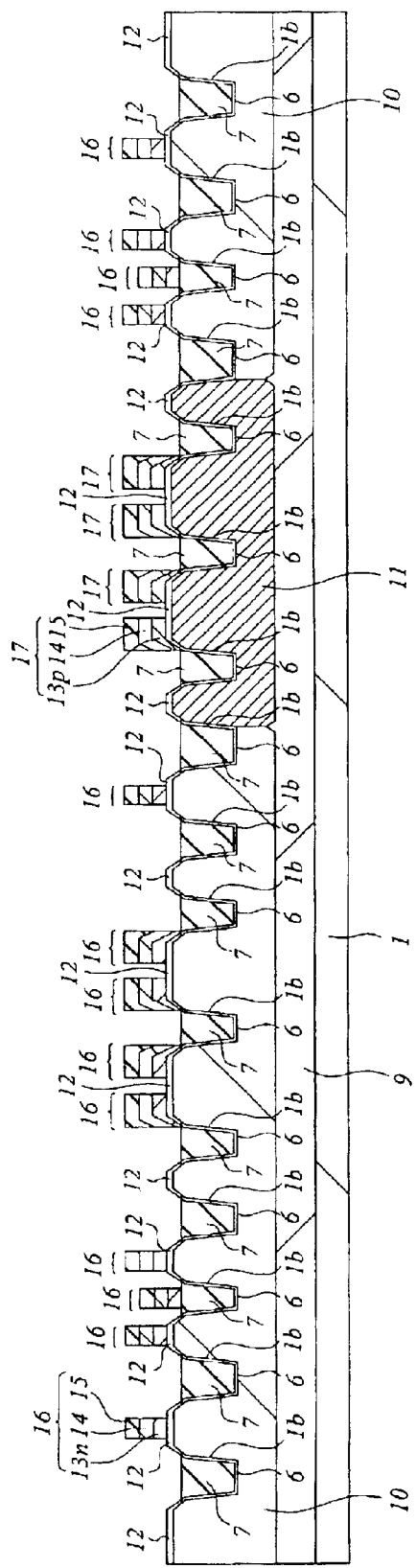
FIG. 17 is a sectional view showing the principal part of the substrate in the course of the manufacturing process of the semiconductor integrated circuit device shown in FIG. 2.

Subsequently, as shown in FIG. 17, gate electrodes 16 and 17 are formed by the dry etching of the polycrystalline silicon films 13n and 13p, the barrier metal film (not shown), the metal film 14, and the polycrystalline silicon films (13n and 13p) with using the hard mask made of the cap insulating film 15. The gate electrode 16 is comprised of the n-type polycrystalline silicon film 13n, the barrier metal film (not shown), and the metal film 14. The gate electrode 17 is comprised of the p-type polycrystalline silicon film 13p, the barrier metal film (not shown), and the metal film 14. Furthermore, the cap insulating film 15 lies on the metal film 14. The gate electrode 16 is referred to as an n-type gate electrode, and the gate electrode 17 is referred to as a p-type gate electrode.

Subsequently, after forming low-concentration semiconductor areas on both edges of the gate electrodes 16 and 17, sidewall spacers are formed on the sidewalls of the gate electrodes 16 and 17. Then, high-concentration semiconductor areas are formed on both edges of the sidewall spacers. In this manner, the n-channel MISFET and the p-channel MISFET are completed. However, illustrations of these MISFETs are omitted.

Subsequently, an interlayer insulating film, a contact electrode, a metal wiring, and the like are formed on the n-channel MISFET and the p-channel MISFET. However, illustrations thereof are omitted.

Also, in the memory cell area (not shown), the n-channel MISFET that constitutes the memory cell is formed through the same process, and an interlayer insulating film, a contact electrode, a metal wiring (bit line), a capacitor electrode and the like are formed on thereon. However, illustrations thereof are omitted.

In this embodiment as described above, p-well active areas (pw3 and pw4) are respectively arranged on both sides of the active areas (pwp1 and pwp2) of an n-channel MISFET pair, and the length (L1) between the active areas pw3 and pwp1 and the length (L3) between the active areas pw4 and pwp2 are set equal to the length (L2) between the active areas pwp1 and pwp2. More specifically, (L1−L2), (L3−L2), and (L1−L3) are all equal to zero. As a result, the device isolation trenches with the lengths L1, L2, and L3 have approximately the same shape, and thus, it is possible to reduce the threshold voltage difference in the MISFET formed on the active area pwp1 or pwp2.

Also, n-well active areas (nw1 and nw2) are respectively arranged on both sides of the active areas (nwp1 and nwp2) of a p-channel MISFET pair, and the length (L4) between the active areas nw1 and nwp1 and the length (L6) between the active areas nw2 and nwp2 are set equal to the length (L5) between the active areas nwp1 and nwp2. More specifically, (L4−L5), (L6−L5), and (L4−L6) are all equal to zero. As a result, the device isolation trenches with the lengths L4, L5, and L6 have approximately the same shape. More specifically, difference in shape of the device isolation trenches is reduced, and it is possible to reduce the threshold voltage difference in the MISFET formed on the active area nwp1 or nwp2. In other words, it is possible to reduce the threshold voltage difference in the MISFET formed on the active areas.

The reason why such advantages can be obtained will be described below.

Figure 20:
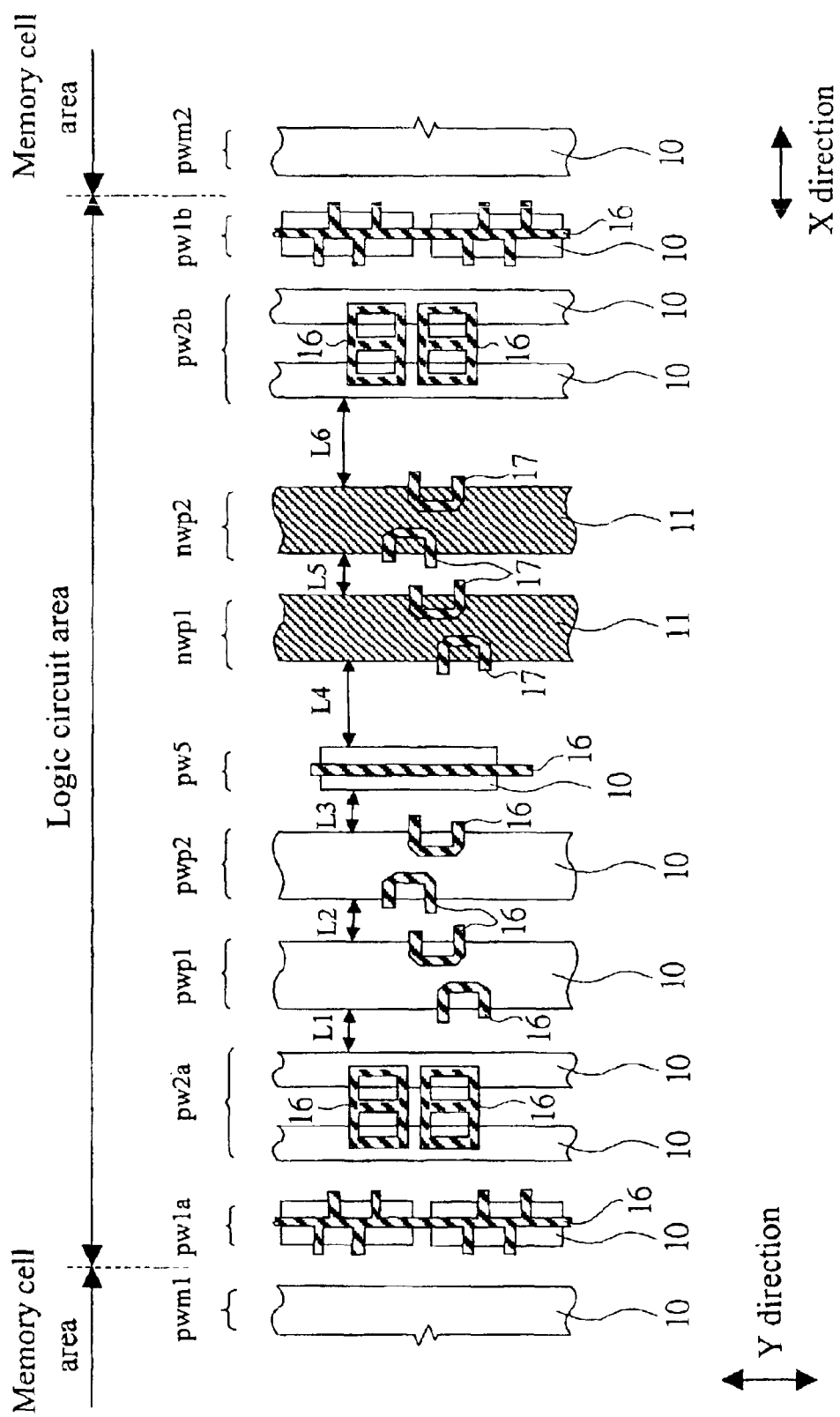
FIG. 20 is another layout diagram showing the principal part of the semiconductor integrated circuit device according to the first embodiment of the present invention.

It is assumed that a semiconductor integrated circuit device has a layout of the logic circuit area as shown in FIG. 20. In this example, widths L4 and L6 of the device isolation trenches closest to a plurality of successively-arranged active areas (nwp1 and nwp2) of the p-channel MISFET pair are about 2 μm, and width L5 of the device isolation trench between the active areas each having a p-channel MISFET pair is about 1 μm.

The width L5 between the active areas of the p-channel MISFET pair is equal to, for example, the total of the diameter of contact holes connected to the gate electrodes of two p-channel MISFETs and a layout margin.

In this case, widths L4 and L6 of the device isolation trenches closest to the active areas of the p-channel MISFET pair are larger than the width L5 between the active areas of the p-channel MISFET pair. This is because p-well active areas (pw5 and pw2b) with a different conductivity type are arranged closest to the active areas (nwp1 and nwp2) of the p-channel MISFET pair. More specifically, since the boundary between the p-well area and the n-well area exists in the device isolation area between the active areas of the p-channel MISFET pair and the closest active areas, the width equivalent to the total of the width L5 and the layout margin necessary to the well isolation is required in the widths L4 and L6.

Therefore, in the layout shown in FIG. 20, the widths of the device isolation trenches that contact to the active areas of the p-channel MISFET pair are different from each other. Therefore, as shown in FIG. 21, the shape of the device isolation trench in the L4 side of the active area (for example, nwp1) of a p-channel MISFET pair is different from that in the L5 side. In FIG. 21, a solid line shows the shape of the device isolation trench in the L4 side of the active area nwp1, and the dotted line shows the shape of the device isolation trench in the L5 side of the same. As just illustrated, the device isolation trenches that contact to the active area of a p-channel MISFET pair are different from each other in their shapes.

In the layout shown in FIG. 20, the gate electrode formed on the active area nwp1 of a p-channel MISFET pair and extending to the L4 portion and the gate electrode formed on the active area nwp1 of a p-channel MISFET pair and extending to the L5 portion are provided, and the threshold voltage difference in the p-channel MISFET pair is about 20 mV. As just described, the threshold voltage difference of about 20 mV is generated in the p-channel MISFET pair whose gate electrodes are formed on the edges of the active area that contacts to the device isolation trenches with the widths L4, L6, and L5.

In this embodiment, however, p-well active areas are arranged closest to the successively-arranged active areas of the n-channel MISFET pair, and n-well active areas are arranged closest to the successively-arranged active areas of the p-channel MISFET pair. Also, the width difference (that is, (L1−L2), (L3−L2), (L1−L3), (L4−L5), (L6−L5), and (L4−L6).) between the device isolation trenches that contact to the edges of the active areas on which the MISFET pair is arranged is set to be zero. Therefore, the difference in shape of the device isolation trenches can be reduced, and thus, the threshold voltage difference in the MISFET pair can be reduced.

Note that, in the layout shown in FIG. 20, the width difference between the isolation trenches, that is, (L4−L5) and (L6−L5) is about 1 μm, and the threshold voltage difference is about 20 mV.

On assumption that the threshold voltage difference be proportional to the width difference between the device isolation trenches as shown in FIG. 22, the width difference between the device isolation trenches smaller than 0.5 μm can reduce the threshold voltage difference to smaller than 10 mV.

Also, in this embodiment, the minimum processing dimension defined to be 0.5 times the word line pitch of a DRAM is set to 0.13 μm. Therefore, when the width difference between the device isolation trenches is made equal to twice the minimum processing dimension (about 0.26 μm), the threshold voltage difference can be reduced to smaller than 5 mV, that is, one-quarter of 20 mV.

It is needless to say that, in the case where the allowable value of the threshold voltage difference is smaller than 5 mV, the width difference between the device isolation trenches must be strictly regulated to smaller than twice the minimum processing dimension, and in the case where the allowable value of the threshold voltage difference is larger than 5 mV, the width difference between the device isolation trenches can be set larger than twice the minimum processing dimension.

It is also needless to say that the allowable value of the width difference between the device isolation trenches should be adjusted in accordance with process parameters, for example, a condition for applying voltage such as substrate voltage and a thickness of a gate oxide film.

It is also needless to say that, in the case where a process in which the width of the device isolation trench relatively little influences on the shape of the device isolation trench is used, the width difference between the device isolation trenches can be set larger than twice the minimum processing dimension, and in the case where a process in which the width of the device isolation trench relatively largely influences on the shape of the device isolation trench is used, the width difference between the device isolation trenches can be set smaller than twice the minimum processing dimension.

However, it is difficult to completely eliminate the dependence of the shape of the device isolation trench on the width of the device isolation trench. Therefore, for the fundamental solution of the problem of the threshold voltage difference in the MISFET pair caused from the change of the shape of the device isolation trenches, the width difference between the device isolation trenches that contact to the edges of the active area on which gate electrodes of the MISFET pair are arranged must be reduced to zero or within the allowable value.

Note that, in this embodiment, two active areas (for example, nwp1 and nwp2) of the MISFET pair that constitute a sense amplifier are successively arranged in two lines. Since the two active areas of the MISFET pair are successively arranged in two lines, the advantages that the sense amplifier pitch can be moderated can be obtained.

FIG. 23 schematically shows a layout in which open bit lines and two sense amplifiers (SA1 and SA2) are arrayed in a line. In this case, it is needed to set the sense amplifier pitch to be equal to about twice the open bit line pitch b, that is, 2b and the layout of the sense amplifiers is relatively difficult.

Meanwhile, FIG. 24 schematically shows a layout in which open bit lines and sense amplifiers (SA1 and SA2) are arrayed in two lines. Since the two sense amplifiers are arrayed in an offset manner, the sense amplifier pitch can be reduced. In the case shown in FIG. 24, since the sense amplifier pitch can be made equal to four times the open bit line pitch b, that is, 4b, it is possible to facilitate the sense amplifier layout. This embodiment in which MISFET pairs that constitute the sense amplifier are arranged in parallel can be effectively used in the sense amplifier layout using the open bit line.

Note that, in this embodiment, the active areas (pw3, pw4, nw1, and nw2) that contact to the active areas of the MISFET pair are not divided (have no gaps) at least relative to the active area of the MISFET pair. Therefore, the widths (for example, L4 and L5) of the device isolation trenches that contact to the edges of the active areas on which the gate electrodes of the MISFET pair are arranged are equal to each other (refer to FIG. 1). Note that the gap mentioned here indicates a part between the active areas (device isolation) in the active area pw1a, which is comprised of a plurality of active areas arranged in the Y direction via the device isolation. In this embodiment, the p-type active areas pw3 and pw4 having no gate electrode on the p-well 10, which function as the p-well power supply areas, are arranged so as not to be divided (have no gaps) relative to the gate electrodes of the MISFET pair.

As shown in FIG. 26, it is also preferable to arrange gate electrodes on the active areas adjacent to the active areas of the MISFET pair. More specifically, the active area pw3 in FIG. 1 is removed, and the length (L1) between the active area pwp1 of the n-channel MISFET pair and the active area pw2a of the n-channel MISFET is made equal to the length (L2) between the pwp1 and pwp2. In addition, the active area pw2b of the n-channel MISFET is arranged at a position of the p-well active area pw4, and the length (L3) between the active area pwp2 of the n-channel MISFET pair and the active area pw2b of the n-channel MISFET is made equal to the length (L2) between pwp1 and pwp2.

As shown in FIG. 27, it is not always required to form the active areas (pw3 and pw4) adjacent to the active areas of the MISFET pair to be undivided areas. More specifically, it is sufficient to arrange the active area at least at a position corresponding to the edge of the gate electrode as shown in FIG. 27. Conversely, in the case where the position of the gaps (device isolation portion between the active areas) of the active area does not correspond to the position of the edges of the gate electrodes, the widths of the device isolation trenches that contact to the edges of the gate electrodes can be made equal to each other. As a result, the threshold voltage difference in the MISFET pair can be reduced.

Further, as shown in FIG. 28, it is also possible to arrange the active areas pw1b and pw1a of the n-channel MISFET at the positions of the n-well active area pw4 and the p-well active area pw3 shown in FIG. 1, respectively. In this case, the active areas (pw1b and pw1a) that contact to the active areas (pwp1 and pwp2) of the MISFET pair have gaps therein (divided). Therefore, there is the possibility that the positions of the gaps of the active areas (pw1b and pw1a) may correspond to the position of the edges of the gate electrodes 16 of the MISFET pair. However, as shown in FIG. 28, in the case where the widths L12 and L11 of the gaps (length between the active areas) are smaller than twice the minimum processing dimension, it is considered that the difference in shape between the device isolation trenches will fall within the allowable value.

In addition, the first embodiment also relates to a layout in which the difference between the width of the device isolation trench located between the active areas on which the p-channel MISFET pair is arranged and the width of the device isolation trench located between the active areas on which the n-channel MISFET pair is arranged is set smaller than the minimum processing dimension.

Also, in the first embodiment, the dummy pattern is provided, and the difference between the width of the device isolation areas that contact to the MISFET pair and the width between the device isolation areas on which the MISFET pair is arranged is reduced to almost zero. As a result, the threshold voltage difference in the MISFET pair which depends on the shape of the device isolation trenches can be reduced.

(Second Embodiment)

The second embodiment relates to a layout in which the width difference between the device isolation trenches that contact to the active areas on which the gate electrodes of the p-channel MISFET pair are arranged is set smaller than twice the minimum processing dimension.

Note that the method of manufacturing a semiconductor integrated circuit device according to the second embodiment is identical to that of the first embodiment described with reference to FIGS. 3 to 17 except that the layout thereof is replaced with that shown in FIG. 29. Thus, the descriptions thereof are omitted.

As shown in FIG. 29, in this embodiment, n-well active areas (nw1 and nw2) having no gate electrode 17 are respectively arranged closest to the successively arranged active areas (nwp1 and nwp2) of the p-channel MISFET pair, and the length (L4) between the active areas nw1 and nwp1 and the length (L6) between the active areas nw2 and nwp2 are set equal to the length (L5) between the active areas nwp1 and nwp2. More specifically, (L4−L5), (L6−L5), and (L4−L6) are all equal to zero. As a result, the change in shape of the device isolation trenches can be reduced and the threshold voltage difference in the MISFET pair can be reduced as described in the first embodiment. In addition, (L4−L5), (L6−L5), and (L4−L6) are set smaller than twice the minimum processing dimension, which makes it possible to reduce the threshold voltage difference in the MISFET pair.

Also, in the second embodiment, a p-type active area pw2 on which an I/O selector circuit is formed and a p-type active area pw5 on which a sense drive circuit is formed are arranged on both sides of the active areas (pwp1 and pwp2) of the n-channel MISFET pair, and the length (L1) between the active areas pw2a and pwp1 and the length (L3) between the active areas pw5 and pwp2 are set equal to the length (L2) between the active areas pwp1 and pwp2. More specifically, (L1−L2), (L3−L2), and (L1−L3) are all equal to zero. As a result, the change in shape of the device isolation trenches can be reduced and the threshold voltage difference in the MISFET pair can be reduced as described in the first embodiment. In addition, (L1−L2), (L3−L2), and (L1−L3) are set smaller than twice the minimum processing dimension, which makes it possible to reduce the threshold voltage difference in the MISFET pair.

Furthermore, in this embodiment, since the widths of the device isolations (L1 to L3) are adjusted depending on the arrangement of the p-type active areas (for example, pw2a and pw5) on which the logic circuit is formed, the high integration (downsizing) of the logic circuit area can be achieved, and simultaneously, the threshold voltage difference particularly generated in the p-channel MISFET pair caused from the shape of the device isolation areas can be reduced.

(Third Embodiment)

The third embodiment relates to a layout in which active areas having the MISFET pair for constituting the sense amplifier are arranged in a line.

Note that the method of manufacturing a semiconductor integrated circuit device according to the third embodiment is identical to that of the first embodiment described with reference to FIGS. 3 to 17 except that the layout thereof is replaced with that shown in FIG. 30. Thus, the descriptions thereof are omitted.

As shown in FIG. 30, the active areas having the MISFET pair are arranged in line. Such an arrangement is used in the sense amplifier layout of the folded bit line arrangement shown in FIG. 25 in which the sense amplifier pitch is moderated.

In this embodiment, as shown in FIG. 30, the cross-coupled circuit having the n-channel MISFET pair is formed in the active area pwp1 of the n-channel MISFET, and the cross-coupled circuit having the p-channel MISFET pair is formed in the active area nwp1 of the p-channel MISFET. These cross-coupled circuits constitute the sense amplifier.

Also, p-well active areas (pw3 and pw4) having no gate electrode 16 are respectively arranged on both sides of the active area (pwp1) of the n-channel MISFET pair, and the length (L1) between the active areas pw3 and pwp1 and the length (L3) between the active areas pw4 and pwp1 are set equal to each other. More specifically, (L1−L3) is equal to zero. As a result, the device isolation trenches each having the lengths L1 and L3 are formed in approximately the same shape, and thus, it is possible to inhibit the threshold voltage difference in the MISFET formed on the active area pwp1. In addition, (L1−L3) is set smaller than twice the minimum processing dimension, which makes it possible to reduce the threshold voltage difference in the MISFET pair.

Also, p-well active areas (nw1 and nw2) having no gate electrode 17 are respectively arranged on both sides of the active area (nwp1) of the p-channel MISFET pair, and the length (L4) between the active areas nw1 and nwp1 and the length (L6) between the active areas nw2 and nwp1 are set equal to each other. More specifically, (L4−L6) is equal to zero. As a result, the device isolation trenches each having the lengths L4 and L6 are formed in approximately the same shape, and thus, it is possible to inhibit the threshold voltage difference in the MISFET formed on the active area nwp1. In addition, (L4−L6) is set smaller than twice the minimum processing dimension, which makes it possible to reduce the threshold voltage difference in the MISFET pair.

Note that, in this embodiment, the active areas (pw3 and pw4) are arranged on both sides of the active area (pwp1) of the n-channel MISFET pair. However, as described in the first embodiment with reference to FIG. 26, it is also possible to arrange the active areas pw2a and pw2b at the positions of the active areas pw3 and pw4. In addition, as shown in FIG. 20, it is also possible to arrange the active areas pw2a and pw5 at the positions of the active areas pw3 and pw4. Furthermore, it is also possible to arrange the active areas pw1a and pw1b at the positions of the active areas pw3 and pw4 as described in the first embodiment with reference to FIG. 28. In this case, the layout should be made so that the positions of the gaps of the active areas (pw1a and pw1b) do not correspond to the positions of the edges of the gate electrodes 16 of the MISFET pair. In addition, the layout should be made so that the widths of the gaps (L12 and L11) are smaller than the twice the minimum processing dimension.

As a result, the high integration of a portion adjacent to the active area of the n-channel MISFET pair can be achieved, and the threshold voltage difference particularly generated in the p-channel MISFET pair caused from the shape of the device isolation areas can be reduced.

(Fourth Embodiment)

The fourth embodiment relates to a layout in which the width of the device isolation trench located between the active areas having the p-channel MISFET pair arranged thereon is set larger than the width of the device isolation trench located between the active areas having the n-channel MISFET pair arranged thereon.

Note that the method of manufacturing a semiconductor integrated circuit device according to the fourth embodiment is identical to that of the first embodiment described with reference to FIGS. 3 to 17 except that the layout thereof is replaced with that shown in FIG. 31. Thus, the descriptions thereof are omitted.

As shown in FIG. 31, in the fourth embodiment, a p-type active area pw5 on which a sense drive circuit is formed and a p-type active area pw2b on which an I/O selector circuit is formed are arranged on both sides of the successively arranged active areas (nwp1 and nwp2) of the p-channel MISFET pair. Also, the length (L5) between the active areas nwp1 and nwp2 of the p-channel MISFET pair is set equal to the length (L4) between the active areas nwp1 and pw5 and the length (L6) between the active areas nwp2 and pw2b. More specifically, (L4–L5), (L6–L5), and (L4–L6) are all equal to zero. As a result, the change in shape of the device isolation trenches can be reduced and the threshold voltage difference in the MISFET pair can be reduced as described in the first embodiment. In addition, (L4–L5), (L6–L5), and (L4–L6) are set smaller than twice the minimum processing dimension, which makes it possible to reduce the threshold voltage difference in the MISFET pair.

Since the width L5 of the device isolation area is determined so as to be equal to the widths L4 and L6 in which the layout margin for the wall isolation is added, the width L5 is made larger than the width of the device isolation area having no well isolation area, for example, the width L2.

Also, in this embodiment, a p-type active area pw2a on which an I/O selector circuit is formed and a p-type active area pw5 on which a sense drive circuit is formed are arranged on both sides of the active areas (pwp1 and pwp2) of the n-channel MISFET pair. Also, the length (L1) between the active areas pw2a and pwp1 and the length (L3) between the active areas pw5 and pwp2 are set equal to the length (L2) between the active areas pwp1 and pwp2. More specifically, (L1–L2), (L3–L2), and (L1–L3) are all equal to zero. As a result, the change in shape of the device isolation trenches can be reduced and the threshold voltage difference in the MISFET pair can be reduced as described in the first embodiment. In addition, (L1–L2), (L3–L2), and (L1–L3) are set smaller than twice the minimum processing dimension, which makes it possible to reduce the threshold voltage difference in the MISFET pair.

Since the well isolation is not required in the device isolation areas with the widths of L1 to L3, it is possible to make the width L1 to L3 smaller than L4 to L6. As a result, the high integration in the device can be achieved.

Also, in this embodiment, the active area pw5 that contacts to the active area nwp1 of the p-channel MISFET pair is divided (has gaps therein). However, the widths L11 and L12 of the gaps are set smaller than twice the minimum processing dimension, and the difference in shape between the device isolation trenches will fall within the allowable value. Also, since it is difficult to ensure the leading-out area of the gate electrode on the gap with such a narrow width, the tips of the gate electrode to be formed on the device area are led out onto the L4 portion. For example, the gate electrode 16 formed on the active area pw5 is formed in the U-shape.

As described above, in the fourth embodiment, the p-type active areas are used as the active areas closest to the active area (n-type active area) of the p-channel MISFET pair, and the lengths therebetween are appropriately adjusted. Therefore, the threshold voltage difference in the MISFET pair having the gate electrodes arranged on the edges of the active area, the difference caused from the shape of the device isolation areas, can be reduced.

(Fifth Embodiment)

The fifth embodiment relates to a layout in which the active areas of the p-channel MISFET pair are arranged separately from each other.

Note that the method of manufacturing a semiconductor integrated circuit device according to the fifth embodiment is identical to that of the first embodiment described with reference to FIGS. 3 to 17 except that the layout thereof is replaced with that shown in FIG. 32. Thus, the descriptions thereof are omitted.

As shown in FIG. 32, in the fifth embodiment, p-type active areas and n-type active areas (pwm1 and pw2a, nw1 and pwm2) are respectively arranged closest to the separately arranged active areas (nwp1 and nwp2) of the p-channel MISFET pair. Also, the width difference between the device isolation trenches that contact to the edges of the active area on which the p-channel MISFET pair are arranged, that is, (L4–L5) and (L6–L7) are equal to zero. Therefore, the difference in shape of the device isolation trenches can be reduced, and thus, the threshold voltage difference in a MISFET pair can be reduced. In addition, (L4–L5) and (L6–L7) are set smaller than twice the minimum processing dimension, which makes it possible to reduce the threshold voltage difference in the MISFET pair.

In addition, as shown in FIG. 33, in the fifth embodiment, the active areas (nwp1 and nwp2) of the p-channel MISFET pair are arranged on both edges of the logic circuit area. Therefore, it is possible to electrically isolate the p-type active areas (pwm1 and pwm2) on which the memory cell is formed and the p-type active areas (pw2a to pw5) on which the n-channel MISFET pairs are arranged. As a result, the high-speed driving of the sense amplifier can be achieved. FIG. 33 is a sectional view showing the principal part of the semiconductor integrated circuit device according to the fifth embodiment of the present invention, and the sectional view is taken along the dotted line m3-m4 in the layout diagram in FIG. 32.

In the fifth embodiment, the high-speed driving of the sense amplifier can be promoted, and the threshold voltage difference particularly generated in the p-channel MISFET pair caused from the shape of the device isolation areas can be reduced.

(Sixth Embodiment)

The sixth embodiment relates to a layout in which, in the gate electrodes of the p-channel MISFET pair, a portion not functioning to isolate the source diffusion layer and the drain diffusion layer is arranged on the active area.

Figure 19:
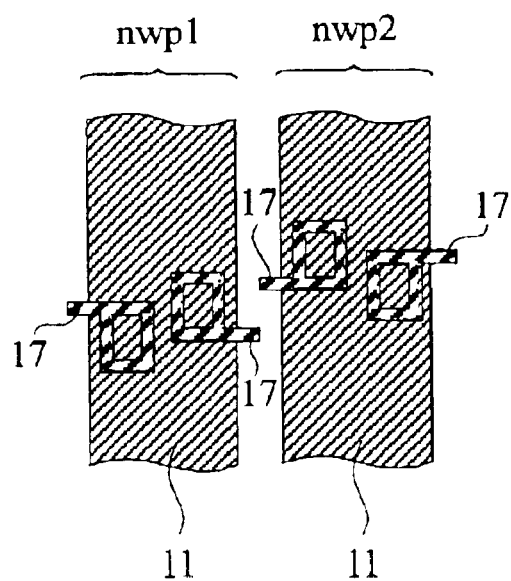
FIG. 19 is a layout diagram showing the principal part of the semiconductor integrated circuit device according to the sixth embodiment of the present invention.

Note that the method of manufacturing a semiconductor integrated circuit device according to the sixth embodiment is identical to that of the first embodiment described with reference to FIGS. 3 to 17 except that the gate electrode thereof has a shape as shown in FIG. 19 (However, active areas nw1, nw2, pw3, and pw4 are not formed). Thus, the descriptions thereof are omitted.

As shown in FIG. 19, in the sixth embodiment, a source diffusion layer (source semiconductor area) and a drain diffusion layer are isolated by rectangle-shaped gate electrodes. Also, a portion not functioning to isolate the source diffusion layer and the drain diffusion layer is provided on the active area, and the portion is led out onto the device isolation area, thereby forming a gate electrode contact. A portion functioning to isolate the source diffusion layer and the drain diffusion layer is a portion of the gate electrode 17 shown in FIG. 19, which surrounds a part of the active area (nwp1 or nwp2) in a rectangular shape. In addition, the portion not functioning to isolate the source diffusion layer and the drain diffusion layer is a portion of the gate electrode 17 in the active area, which protrudes from the rectangle portion toward the device isolation.

Note that in the sixth embodiment, only the active areas (nwp1 and nwp2) of the p-channel MISFET pair are shown. However, it is needless to say that it is also possible to use the same gate electrode to the n-channel MISFET pair.

As described above, in this embodiment, the threshold voltage difference in the MISFET pair can be reduced regardless of the shape of the device isolation trenches.

In the foregoing, the invention made by the inventors of this invention has been described in detail based on the embodiments. However, it goes without saying that the present invention is not limited to the above-described embodiments, and various changes and modifications of the invention can be made without departing from the spirit and scope of the invention.

The advantages achieved by the typical ones of the inventions disclosed in this application will be briefly described as follows.

By the control of the width difference between the device isolation trenches that contact to the edges of the active area on which the gate electrodes of the MISFET pair of the sense amplifier circuit are arranged, it is possible to inhibit the threshold voltage variation in the MISFET pair having the gate electrodes arranged on the edges of the active area, the difference caused from the shape of the device isolation areas.

In addition, the high integration in the active area of the n-channel MISFET pair can be achieved, and also, the threshold voltage difference generated in the n-channel MISFET pair and caused from the shape of the device isolation areas can be reduced.

In addition, since the n-type active area on which the p-channel MISFET pair is arranged and the p-type active area on which the n-channel MISFET pair is arranged are arranged in consideration of the device isolation areas, it is possible to promote the high-speed driving of the sense amplifier.

What is claimed is:

1. A semiconductor integrated circuit device, comprising:
   (a) a device forming area;
   (b) first and second isolation areas adjacent to both edges of the device forming area, the first and second isolation areas being formed in first and second device isolation trenches, respectively; and
   (c) first and second gate electrodes formed crossing over the device forming area and the first and second isolation area respectively, the first gate electrode being arranged over the device forming area and the first isolation area on one edge of the device forming area, and the second gate electrode being arranged crossing over the device forming area and the second isolation area on another edge of the device forming area,
   wherein the first and second device isolation trenches have approximately the same width.

2. A semiconductor integrated circuit device, comprising:
   (a) a device forming area;
   (b) first and second isolation areas adjacent to both edges of the device forming area, the first and second isolation areas being formed in first and second device isolation trenches, respectively; and
   (c) first and second gate electrodes formed crossing over the device forming area and the first and second isolation area respectively, the first gate electrode being arranged crossing over the device forming area and the first isolation area on one edge of the device forming area, and the second gate electrode being arranged crossing over the device forming area and the second isolation area on another edge of the device forming area,
   wherein a width difference between the first and second device isolation trenches is smaller than twice a width of a half of a word line pitch.

3. The semiconductor integrated circuit device according to claim 2,
   wherein the first and second gate electrodes respectively constitute first and second MISFETs, and the first and second MISFETs share either a source area or a drain area.

4. The semiconductor integrated circuit device according to claim 2,
   wherein the first and second gate electrodes respectively constitute first and second MISFETs, the first and second MISFETs share either a source area or a drain area, the source area or the drain area not being shared by the first MISFET is connected to the gate electrode of the second MISFET, and the source area or the drain area not being shared by the second MISFET is connected to the gate electrode of the first MISFET.

5. The semiconductor integrated circuit device according to claim 2,
   wherein the first and second gate electrodes are U-shaped, and ends of the first and second gate electrodes are located over the first and second isolation areas, respectively.

6. The semiconductor integrated circuit device according to claim 2,
   wherein the device forming area is a p-type semiconductor area;
   the first and second gate electrodes constitute first and second n-channel MISFETs, respectively; and
   the first and second n-channel MISFETs are cross-connected to form a sense amplifier circuit.

7. The semiconductor integrated circuit device according to claim 2,
   wherein the device forming area is an n-type semiconductor area;
   the first and second gate electrodes constitute first and second p-channel MISFETs, respectively; and
   the first and second p-channel MISFETs are cross-connected to form a sense amplifier circuit.

8. The semiconductor integrated circuit device according to claim 2,
   wherein a first active area is arranged outside the first isolation area; and
   a second active area is arranged outside the second isolation area.

9. The semiconductor integrated circuit device according to claim 8,
   wherein no MISFET is formed over the first and second active areas.

10. The semiconductor integrated circuit device according to claim 8, wherein a power supply unit for applying voltage to the device forming areas is formed over the first and second active areas.

11. The semiconductor integrated circuit device according to claim 8,
    wherein the first and second active areas are n-type semiconductor areas;
    the first and second gate electrodes over the device forming areas respectively constitute p-channel MISFETs; and
    the first and second p-channel MISFETs are cross-connected to form a sense amplifier circuit.

12. The semiconductor integrated circuit device according to claim 8,
    wherein the first and second gate electrodes over the device forming area respectively constitute MISFETs that form a sense amplifier circuit; and wherein a MISFET which constitutes a circuit other than the sense amplifier circuit is formed over the first or second active area.

13. The semiconductor integrated circuit device according to claim 8, wherein the first or second active area is further isolated into a plurality of active areas; and ends of the first and second gate electrodes are not located at positions corresponding to the positions between the plurality of active areas.

14. The semiconductor integrated circuit device according to claim 8, wherein the first or second active area is further isolated into a plurality of active areas; and a plurality of distances between the plurality of active areas are set smaller than twice a width of a half of a word line pitch.

15. A semiconductor integrated circuit device, comprising:

(a) first and second device forming areas;

(b) first and second isolation areas adjacent to both edges of the first and second device forming areas, the first and second isolation areas being formed in first and second device isolation trenches, respectively;

(c) a third isolation area located between the first and second device forming areas, the third isolation area being formed in a third device isolation trench;

(d) first and second gate electrodes formed over the first device forming area, the first gate electrode being arranged on both the first device forming area and the first isolation area, and the second gate electrode being arranged on both the first device forming area and the third isolation area; and (e) third and fourth gate electrodes formed over the second device forming area, the third gate electrode being arranged on both the second device forming area and the second isolation area and the fourth gate electrode being arranged on both the second device forming area and the third isolation area, wherein the width difference among the first, second, and third device isolation trenches is smaller than twice a width of a half of a word line pitch.

16. The semiconductor integrated circuit device according to claim 15, wherein the first and second gate electrodes constitute a MISFET pair which constitute a first sense amplifier circuit; and the third and fourth gate electrodes constitute a MISFET pair which constitute a second sense amplifier circuit.

17. The semiconductor integrated circuit device according to claim 16, wherein the first and second sense amplifier circuits are applicable to open bit lines.

* * * * *